US007622756B2

(12) United States Patent  
Sasaki et al.

(10) Patent No.: US 7,622,756 B2  
(45) Date of Patent: Nov. 24, 2009

(54) SEMICONDUCTOR DEVICE AND RADIO COMMUNICATION DEVICE

(75) Inventors: Satoshi Sasaki, Takasaki (JP); Yasunari Umemoto, Sayama (JP); Yasuo Osone, Kasumigaura (JP); Tsutomu Kobori, Takasaki (JP); Chushiro Kusano, Niiza (JP); Isao Ohbu, Sagamihara (JP); Kenji Sasaki, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 523 days.

(21) Appl. No.: 11/319,084

(22) Filed: Dec. 28, 2005

(65) Prior Publication Data

US 2006/0138460 A1 Jun. 29, 2006

(30) Foreign Application Priority Data

Dec. 28, 2004 (JP) .............................. 2004-379283

(51) Int. Cl.  
*H01L 27/082* (2006.01)  
*H01L 27/102* (2006.01)  
(52) U.S. Cl. ............... 257/205; 257/566; 257/E27.053; 257/E27.076

(58) Field of Classification Search ................. 257/197, 257/566, 571, 205, E27.053, E27.076  
See application file for complete search history.

(56) References Cited

U.S. PATENT DOCUMENTS 6,376,898 B1 * 4/2002 Uda et al. .................... 257/566  
6,545,340 B1 * 4/2003 Higgs et al. ................. 257/565

FOREIGN PATENT DOCUMENTS

JP 2001-237319 8/2001  
JP 2004-6531 1/2004

* cited by examiner

*Primary Examiner*—Evan Pert  
(74) *Attorney, Agent, or Firm*—Antonelli, Terry, Stout & Kraus, LLP.

(57) ABSTRACT

A technology which allows a reduction in the thermal resistance of a semiconductor device and the miniaturization thereof is provided. The semiconductor device has a plurality of unit transistors Q, transistor formation regions $3a$, $3b$, and $3e$ each having a first number (seven) of the unit transistors Q, and transistor formation regions $3c$ and $3d$ each having a second number (four) of the unit transistors Q. The transistor formation regions $3c$ and $3d$ are located between the transistor formation regions $3a$, $3b$, $3e$, and $3f$ and the first number is larger than the second number.

13 Claims, 27 Drawing Sheets

SEMICONDUCTOR DEVICE AND RADIO COMMUNICATION DEVICE

CROSS-REFERENCE TO RELATED APPLICATION

The present application claims priority from Japanese patent application No. 2004-379283 filed on Dec. 28, 2004, the content of which is hereby incorporated by reference into this application.

BACKGROUND OF THE INVENTION

The present invention relates to a semiconductor device. More particularly, it relates to a technology which is effective when applied to a semiconductor device having hetero-junction bipolar transistors (hereinafter referred to as HBTs) and to a radio communication device using the same.

In a HBT using different semiconductor materials for an emitter and a base (e.g., AlGaAs/GaAs, InGaP/GaAs, or the like), a collector current can be increased without lowering a current amplification factor since the leakage of holes into the emitter is suppressed by the barrier of the emitter-base junction thereof. In addition, a reduction in the film thickness of the base layer reduces the transit time of electrons and thereby allows an increase in the response speed of the transistor, i.e., the RF operation thereof.

Accordingly, the HBT has characteristics suitable for use in an RF (Radio Frequency) power amplifier, such as large current and RF operation. However, there is the possibility that a large base current may flow in the transistor due to heat variations and a local temperature rise to consequently increase a collector current and cause the defect that the emitter-collector junction breaks down. In spite of this, there has been a growing need for the miniaturization of a radio communication device (e.g., a mobile telephone or the like). Therefore, it has been required to scale down the semiconductor chip of a semiconductor device formed with the HBT, while suppressing an increase in the thermal resistance thereof.

Japanese Unexamined Patent Publication No. 2001-237319 (Patent Document 1) has a description on the layout of a semiconductor integrated circuit comprising an amplifier circuit consisting of a plurality of transistors arranged as a matrix on a single semiconductor chip. To suppress heat generation from the transistors, the layout divides the transistors into a plurality of groups by assigning a specified number of the transistors in the same row to one of the groups and equispacedly arranges the transistors in each of the groups. In this case, the spacing between the individual groups is adjusted to be larger than the spacing between the individual transistors in each of the groups.

[Patent Document 1] Japanese Unexamined Patent Publication No. 2001-237319

SUMMARY OF THE INVENTION

The present inventors have developed a semiconductor device for an RF power amplifier module. FIGS. 30 to 32 are circuit diagrams of a semiconductor device comprising an amplifier circuit examined by the present inventors, which is an amplifier circuit composed of a plurality of unit transistors. FIG. 33 is a plan view of the semiconductor device which corresponds to the circuit shown in FIG. 32. FIG. 34 is a schematic cross-sectional view of the semiconductor device viewed in the x-direction of FIG. 33, which illustrates a temperature distribution when the semiconductor device is operated.

In the case where the circuit has a structure as shown in FIG. 30, a collector current in a specified one of the unit transistors (Q' n; n is a natural number) is increased by variations in the characteristics of the individual unit transistors and the different thermal environments resulting from the locations thereof. In the specified unit transistor, a positive feedback occurs in which heat generation and an increased junction temperature caused by the increased collector current further increases the collector current. Accordingly, it can be considered that current localization to the specified unit transistor occurs, leading to the thermal runaway.

In the case where the circuit has a structure as shown in FIG. 31, the one-by-one insertion of base ballast resistors (RB' n; n is a natural number) in the respective bases of the individual unit transistors causes the tendency toward suppressing the current increase resulting from the heat generation and the increased junction temperature. However, since the respective base potentials (P' n; n is a natural number) of the individual unit transistors are not independent of each other, the respective bases of the individual unit transistors are at the same potential. Accordingly, it can be considered that a decrement in the base voltage of the unit transistor is small and therefore the current localization cannot be prevented.

In the case where the circuit has a structure as shown in FIG. 32, the base potentials of the individual unit transistors become independent of each other by inserting capacitors (Cin' n; n is a natural number) between the respective bases and RF inputs of the unit transistors. When current localization to a specified one of the unit transistors is likely to occur, the base ballast resistor causes the base potential to drop, thereby suppressing an increase in collector current and the thermal runaway. When an excessive voltage such as static electricity or the like is applied to each of the unit transistors, the unit transistor can be protected from breakdown by further connecting a protective circuit in parallel to the output side of the amplifier, though it is not depicted. Therefore, it can be considered that a semiconductor device having a circuit capable of suppressing the thermal runaway of the semiconductor device as shown in FIG. 32 is suitable for use in an RF power amplifier module. For example, the device layout of the circuit shown in FIG. 32 can be generated as shown in FIG. 33. The reference numerals Q', RB', Cin', and 102a denote a unit transistor, a base ballast resistor, a capacitor, and a protective element, respectively. The reference numerals 103, 104S, and 114 denote a formation region, a substrate, and a protruding region, respectively. The reference numerals 105, 106, and 107EL denote an RF signal line, a DC signal line, and an emitter line, respectively. The emitter line 107EL is shown in a perspective manner. The reference numerals 111 and 112 denote a pad and a via hole, respectively.

In the case of adopting the semiconductor device using the HBTs formed on a substrate made of GaAs as unit transistors, however, a reduction in the thermal resistance of the semiconductor device is important since an amount heat generation from the HBTs is large and the thermal conductivity of GaAs is low. On the other hand, there has been a miniaturization request on the semiconductor device for use in an RF power amplifier module.

In the case of adopting the semiconductor device having a layout in which thirty-six unit transistors Q' are arranged as a matrix as shown in FIG. 33, when the semiconductor device is operated, the temperature of the inner portion of the substrate 104D viewed in the x-direction becomes higher than that of the outer portion thereof, as shown in FIG. 34, so that the unit transistors Q' placed in the inner portion determine the disruptive strength and lifetime of the device. To reduce the temperature increase in the inner portion, it can be considered to enlarge the layout region by increasing the spacing between the unit transistors in the inner portion. However, the enlarged layout region mostly inhibits the miniaturization of the semiconductor device.

In the semiconductor device having a layout as shown in FIG. 33, the generally rectangular formation region 103 is provided with the protruding region 114 in which a protective element 102a composing the protective circuit is to be placed and the protective element 102a is placed therein. Such a layout provided with the protruding region 114 mostly inhibits the miniaturization of the semiconductor device.

An object of the present invention is to provide a technology which allows a reduction in the thermal resistance of a semiconductor device and the miniaturization thereof.

Another object of the present invention is to provide a radio communication device using the miniaturized semiconductor device that has been reduced in thermal resistance.

The above and other objects and novel features of the present invention will become apparent from the description of the present specification and the accompanying drawings.

A brief description will be given to the outline of the representative aspects of the present invention disclosed in the present application.

One aspect of the present invention is a semiconductor device including a plurality of unit transistors, comprising: a plurality of first transistor formation regions each having a first number of the unit transistors; and a second transistor formation region having a second number of the unit transistors, wherein the second transistor formation region is located between the first transistor formation regions, wherein the first number is larger than the second number.

Another aspect of the present invention is a radio communication device comprising a power amplifier, wherein the power amplifier is composed of a semiconductor device having a plurality of unit transistors, wherein the semiconductor device has: a plurality of first transistor formation regions each having a first number of the unit transistors; and a second transistor formation region having a second number of the unit transistors, wherein the second transistor formation region is located between the first transistor formation regions, and wherein the first number is larger than the second number.

The following is the brief description of effects achievable by the representative aspects of the invention disclosed in the present application.

There can be provided a technology which allows a reduction in the thermal resistance of a semiconductor device and the miniaturization thereof.

There can be provided a radio communication device using the miniaturized semiconductor device that has been reduced in thermal resistance.

DESCRIPTION OF THE PREFERRED EMBODIMENTS

Figure 1:
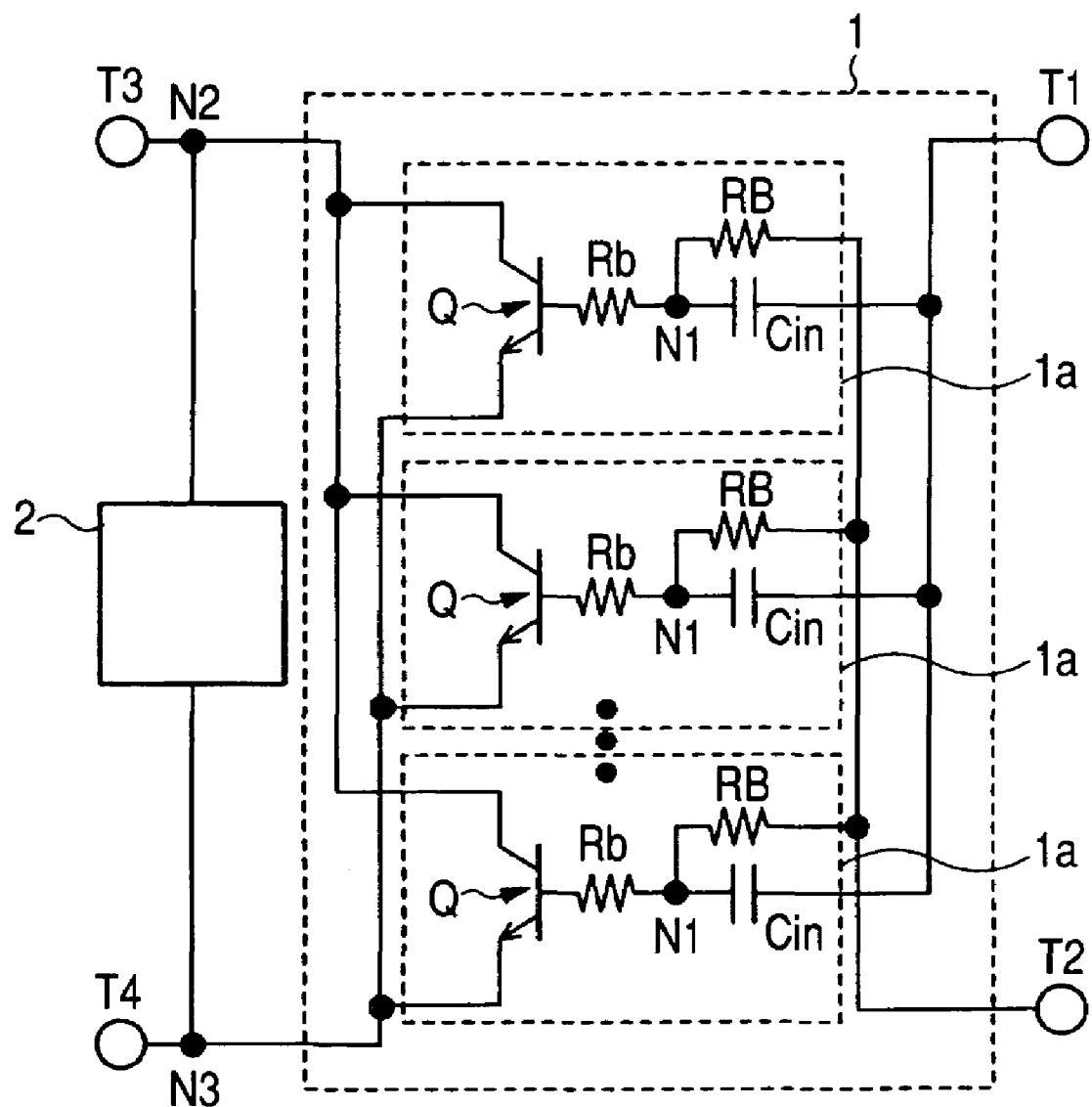
FIG. 1 is a circuit diagram of an output circuit and a protective circuit formed in a semiconductor device shown in Embodiment 1 of the present invention.

Referring now to the drawings, the embodiments of the present invention will be described herein below in detail. Throughout the drawings for illustrating the embodiments of the present invention, the parts are designated in principle by the same reference numerals and the repeated description thereof will be omitted.

Embodiment 1

A semiconductor device shown in Embodiment 1 will be described with reference to FIGS. 1 to 13. The description will be given first to an amplifier circuit and a protective circuit in the semiconductor device shown in the present embodiment with reference to FIGS. 1 and 2, in which FIG. 1 is a circuit diagram of an amplifier circuit 1 and a protective circuit 2 in the semiconductor device shown in the present embodiment and FIG. 2 is a circuit diagram of the protective circuit 2 shown in FIG. 1.

Figure 2:
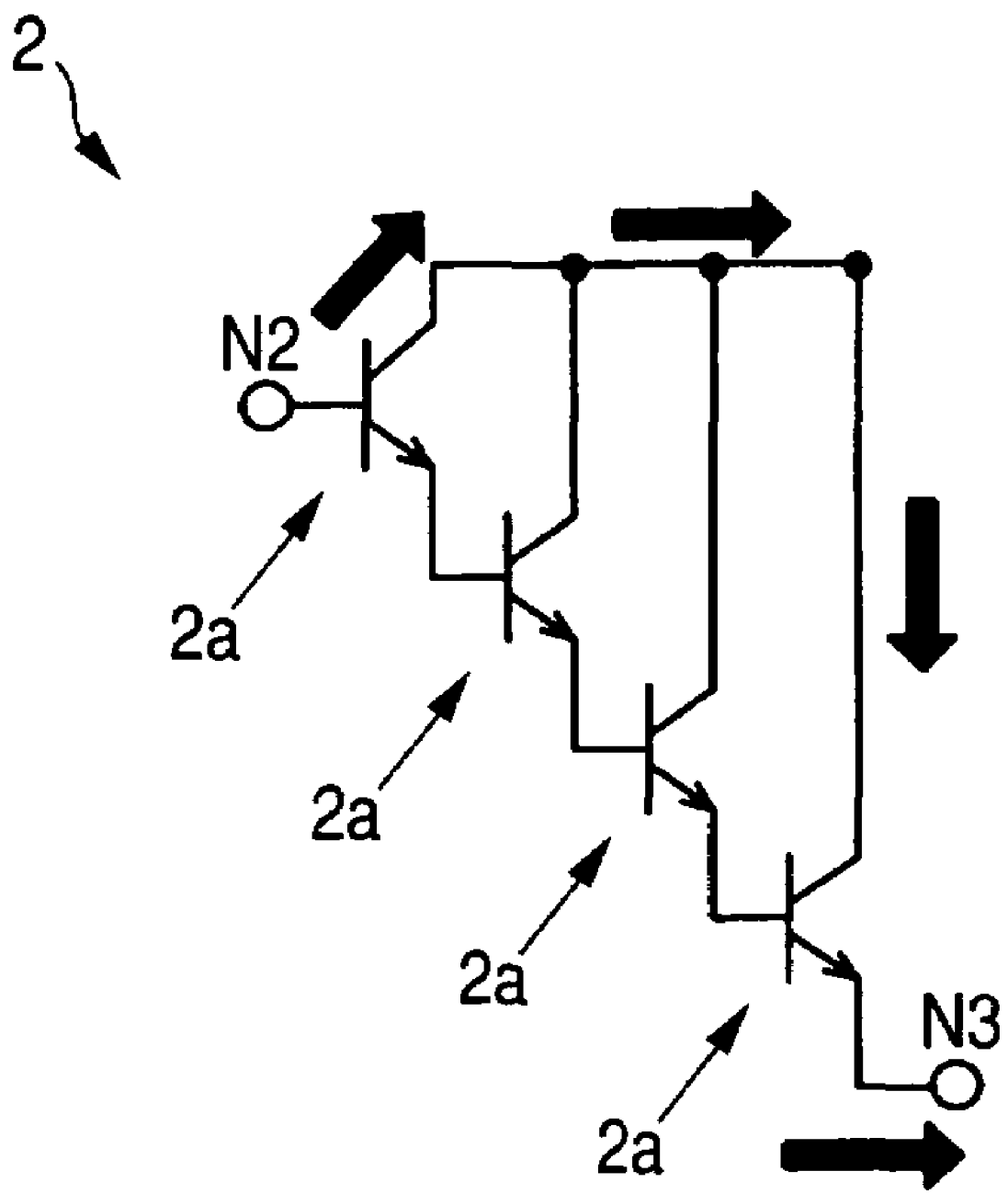
FIG. 2 is a circuit diagram of the protective circuit shown in FIG. 1.

As shown in FIG. 1, the amplifier circuit is constituted by a plurality of unit cells 1a connected in parallel. Each of the unit cells 1a is composed of a unit transistor Q which is, e.g., a hetero-junction bipolar transistor (hereinafter referred to as the HBT) and additional elements which are a base ballast resistor PB, a base resistor Rb, and a capacitor Cin.

The plurality of unit transistors Q have respective collectors coupled to each other, respective emitters coupled to each other, and respective bases coupled to each other via the respective base resistors Rb and capacitors Cin of additional circuits and are connected in parallel to each other. As a result, the amplifier circuit 1 is constituted to operate as though it is a single transistor with a common RF signal inputted to the input-side bases from a terminal T1.

The base resistor Rb and the capacitor Cin are connected between the base of each of the unit transistors Q and the terminal T1 and the base ballast resistor Rb is connected between a connection node N1 providing connection between the base resistor Rb and the capacitor Cin and a terminal T2 for a DC signal. On the output side of the amplifier circuit 1, on the other hand, the respective collectors of the individual unit transistors Q are connected commonly to a terminal T3 and the respective emitters of the individual unit transistors Q are connected commonly to a terminal T4.

Accordingly, the amplifier circuit 1 has a structure in which the RF signal from the terminal T1 is inputted to the base of each of the unit transistors Q via the capacitor Cin and a DC signal is given to the connection node N1 between the base resistor Rb and the capacitor Cin via the base ballast resistor Rb. Since the DC signal is given via the base ballast resistor Rb, the advantages are offered that the thermal runaway (misoperation resulting from temperature variations) of the unit transistors Q resulting from thermal variations in base potential can be prevented and that a gain reduction in an RF region can be reduced by inputting the RF signal to the base of each of the unit transistors Q via the capacitor Cin even when the base ballast resistor RB is increased. It is also possible to omit the base resistor Rb, but the presence of the resistor can prevent the base potential from oscillation.

On the other hand, the protective circuit 2 is connected between a connection node N2 closer to the terminal T3 and a connection node N3 closer to the terminal T4. In other words, the protective circuit 2 is connected to the output side of the amplifier circuit 1 shown in FIG. 1. As shown in FIG. 2, the protective circuit 2 has four protective elements 2a each composed of, e.g., an npn-type bipolar transistor between the connection nodes N2 and N3. The four protective elements 2a have respective collectors electrically connected to each other to provide Darlington connections. By increasing the number of the Darlington connections, a high voltage is applied between the collector and emitter of the final-stage bipolar transistor (which is the four-stage bipolar transistor in FIG. 2) of the protective circuit 2 to occasionally cause the breakdown of the final-stage bipolar transistor. Accordingly, the number of the Darlington connections is set to prevent the occurrence of such breakdown.

As indicated by the arrow in FIG. 2, a current flowing in the protective circuit 2 under load flows from the base of the first-stage bipolar transistor to the collector thereof, passes through the common line for the collectors, and flows from the collector of the fourth-stage bipolar transistor to the emitter thereof. The number of the protective elements 2a (the number of the Darlington connections) of the protective circuit 2 is basically set in accordance with a voltage permitted to be applied between the terminals T3 and T4 of the amplifier circuit 1 of FIG. 1, i.e., the breakdown voltage of the amplifier 1. Although Embodiment 1 has shown the protective elements 2a in four stages by way of example, when the breakdown voltage of the amplifier circuit 1 is increased, the protective elements 2a of the protective circuit 2 may be provided arbitrarily in a larger number of stages, such as five or seven.

Figure 3:
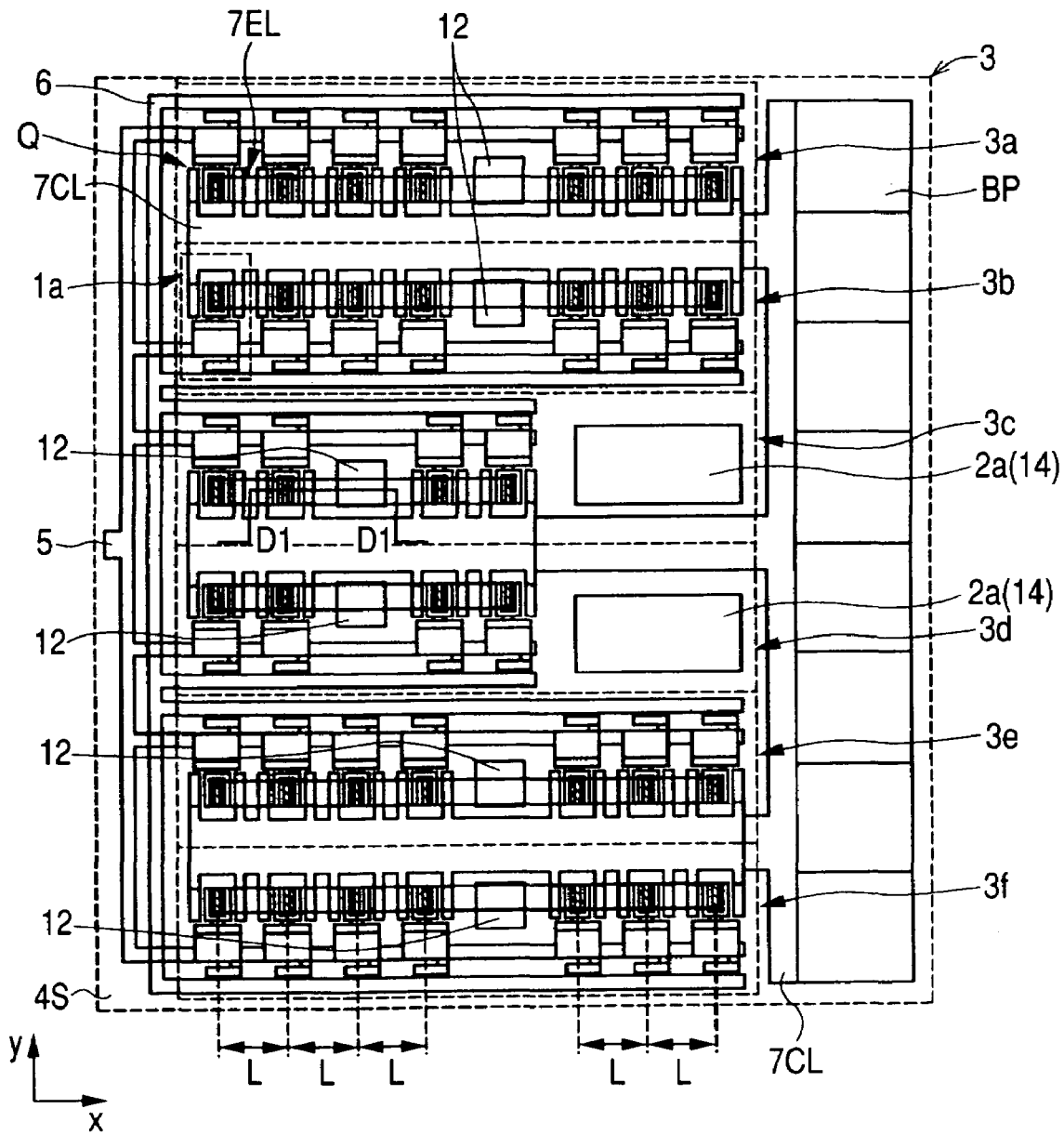
FIG. 3 is a principal-portion schematic plan view of the semiconductor device shown in Embodiment 1.
Figure 4:
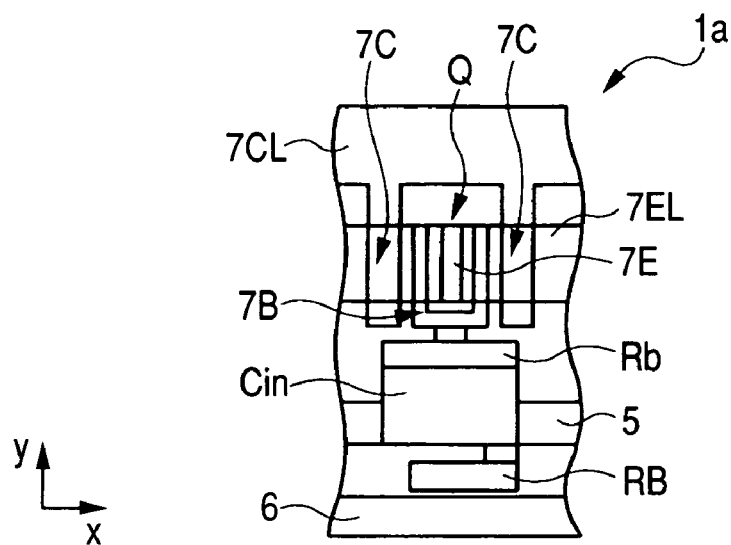
FIG. 4 is an enlarged schematic plan view of the semiconductor device shown in FIG. 3.
Figure 5:
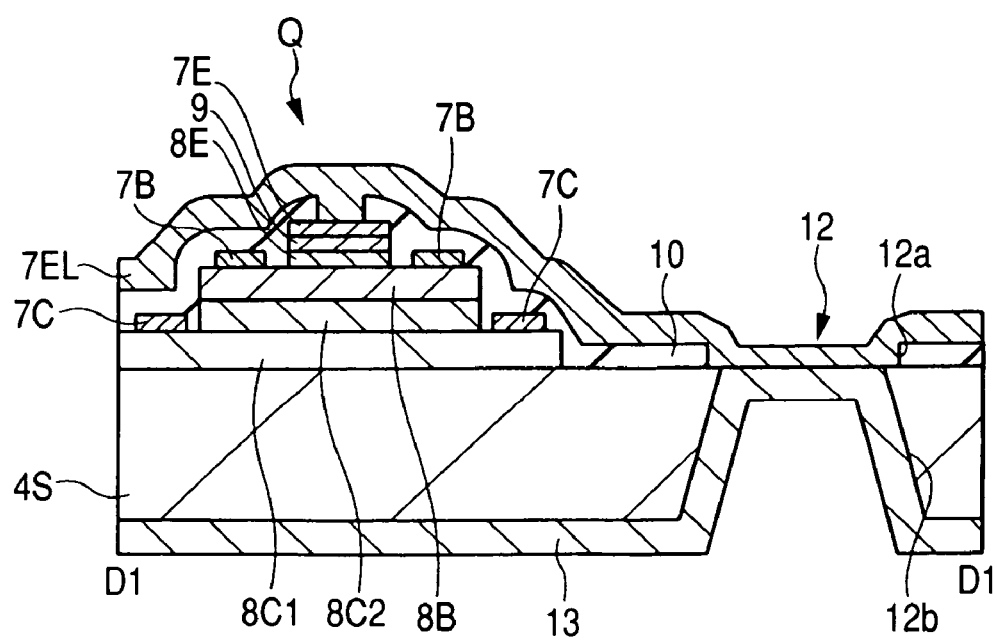
FIG. 5 is a schematic cross-sectional view of the semiconductor device taken along the line D1-D1 of FIG. 3.

The description will be given next to the device layout of the principal portion of the semiconductor device shown in the present embodiment with reference to FIGS. 3 to 5. FIG. 3 is a principal-portion schematic plan view of the semiconductor device shown in the present embodiment. FIG. 4 is an enlarged schematic plan view of one of the unit cells 1a of FIG. 3. FIG. 5 is a schematic cross-sectional view of the semiconductor device taken along the line D1-D1 of FIG. 3. The amplifier circuit 1 and the protective circuit 2 each shown in FIG. 1 have been laid out in the specified region (hereinafter referred to as "formation region") of the substrate 4S.

As shown in FIG. 3, the formation region 3 of the substrate 4S is formed with, e.g., thirty-six unit cells 1a, the protective elements 2a (which are represented by the blocks in FIG. 3), an RF signal line 5, a DC signal line 6, a collector line 7CL, an emitter line 7EL, pads BP, and six via holes 12. The formation region 3 is provided with a plurality of regions (hereinafter referred to as "transistor formation regions") 3a, 3b, 3c, 3d, 3e, and 3f which are arranged in the y-direction. Each of the transistor formation regions 3a, 3b, 3c, 3d, 3e, and 3f has the plurality of unit cells 1a which are arranged with equal spacings (Dimensions L) in the x-direction to form a row. In short, the unit cells 1a are arranged as a matrix in the formation region.

The collector line 7CL is disposed to extend in the y-direction in the formation region 3 on the right-hand side of FIG. 3 and connected to the pads BP, while it is also disposed to extend in the x-direction. The RF signal line 5 is disposed to extend in the y-direction on the left-hand side of FIG. 3, while it is also disposed to extend in the x-direction. Likewise, the DC signal line 6 is disposed to extend in the y-direction on the left-hand side of FIG. 3, while it is also disposed to extend in the x-direction.

As shown in FIG. 4, each of the unit cells 1a has the unit transistor Q and the additional elements which are the base ballast resistor RB, the capacitor Cin, and the base resistor Rb. The unit transistor Q has an emitter electrode 7E electrically connected to the emitter line 7EL (which is depicted in a perspective manner in the drawing), a base electrode 7B electrically connected to the base resistor Rb, and a collector electrode 7C electrically connected to the collector line 7CL. On the other hand, the RF signal line 5 is electrically connected to the capacitors Cin and the DC signal line 6 is electrically connected to the base ballast resistors RB.

FIG. 5 shows the cross-sectional structure of the unit transistor Q and the via hole 12. On the substrate 4S, the individual layers are formed in the order of an n-type sub-collector layer 8C1, an n-type collector layer 8C2, a p-type base layer 8B, an n-type emitter layer 8E, and a contact layer 9. The emitter electrode 7E is formed on the contact layer 9, the base electrode 7B is formed on the base layer 8B, and the collector electrode 7C is formed on the n-type sub-collector layer 8C1. The via hole 12 has a hole portion 12a formed in an insulating film 10 and a hole portion 12b extending through the substrate 4S from the main surface thereof to the back surface thereof along the thickness thereof. The hole portions 12a and 12b are formed to have generally rectangular plan configurations at two-dimensionally overlapping positions. A part of the emitter line 7EL is filled in the hole portion 12a, while a part of a common back surface electrode 13 formed on the back surface of the substrate 4S is filled in the hole portion 12b, so that the emitter line 7EL on the main surface of the substrate 4S and the back surface electrode 13 on the back surface of the substrate 4S are in contact with and electrically connected to each other through the via hole 12. By thus locating the via hole 12 in adjacent relation to the unit transistor Q, heat generated from the unit transistor Q can be dissipated through the via hole 12.

As shown in FIG. 3, the unit cells 1a including the unit transistors Q are primarily placed in the formation region 3. Besides, the protective element 2a, the via holes 12, and the like are placed in the formation region 3. More specifically, in the outer (upper in FIG. 3) transistor formation regions 3a and 3b of the formation region 3, seven unit cells 1a together with one via hole 12 are arranged in the x-direction. That is, in each of the transistor formation regions 3a and 3b, the four left-side unit transistors Q (unit cells 1a) and the three right-side unit transistors Q are arranged equispacedly with the via hole 12 interposed therebetween. By thus positioning the via hole 12 substantially in the middle of the plurality of unit transistors Q, it becomes possible to prevent the temperature of each of the transistor formation regions 3a and 3b from becoming higher at the middle position thereof and reduce the thermal resistance of the semiconductor device. Although the unit cell 1a can also be placed in the region formed with the via hole 12, the via hole 12 is preferably positioned substantially in the middle of the plurality of unit transistors Q to allow easy dissipation of heat generated from the unit transistors Q composing the unit cells 1a during the operation thereof.

Likewise, seven unit cells 1a and one via hole 12 are arranged in a row in each of the outer (lower in FIG. 3) transistor formation regions 3e and 3f of the formation region 3. In each of the transistor formation regions 3e and 3f, the four left-side unit cells 1a and the three right-side unit cells 1a are arranged equispacedly with the via hole 12 interposed therebetween.

On the other hand, in each of the inner transistor formation regions 3c and 3d of the formation region 3 which are located between the transistor formation regions 3a and 3b and the transistor formation regions 3e and 3f, the four unit cells 1a, one via hole 12, e.g., and two protective elements 2a (represented by one block), e.g., are arranged in a row. In each of the transistor formation regions 3c and 3d, the two left-side unit cells 1a and the two right-side unit cells 1a are arranged equispacedly to provide a bilaterally symmetrical configuration with the via hole 12 interposed therebetween, while the protective elements 2a are arranged on a side with the respective one ends of the formation regions 3c and 3d. By thus placing the unit cells 1a and the via hole 12 on the left-hand side of FIG. 3, a region 14 (hereinafter referred to as a "vacant region") in which the unit cells 1a and the via hole 12 are not placed is formed and the protective elements 2a are placed in the vacant region 14. Although the present embodiment has placed the protective elements 2a for protecting the unit transistors Q in the vacant region 14, a passive element such as a capacitor element may also be placed therein.

Figure 6:
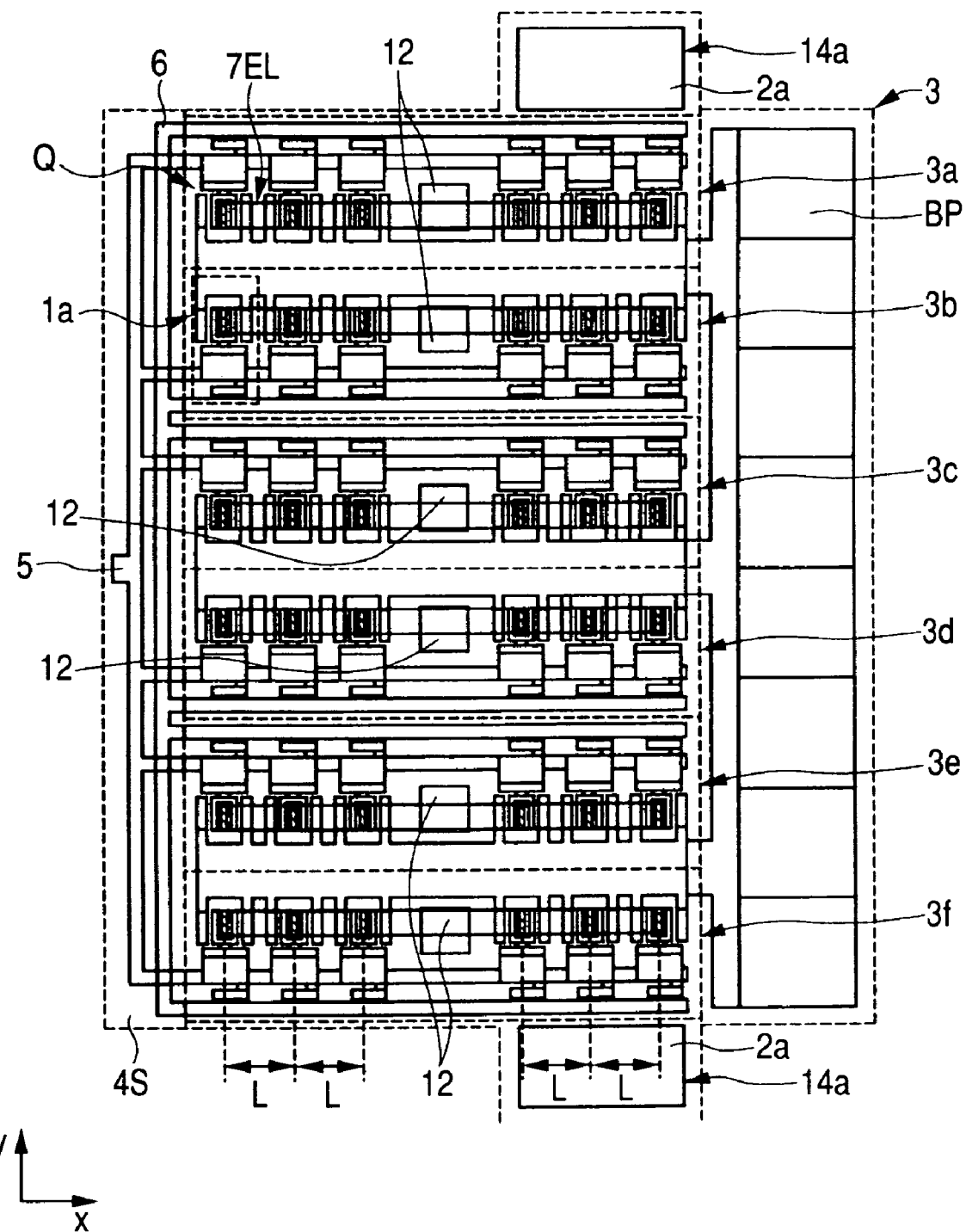
FIG. 6 is a principal-portion schematic plan view of an example of a semiconductor device examined by the present inventors.
Figure 7:
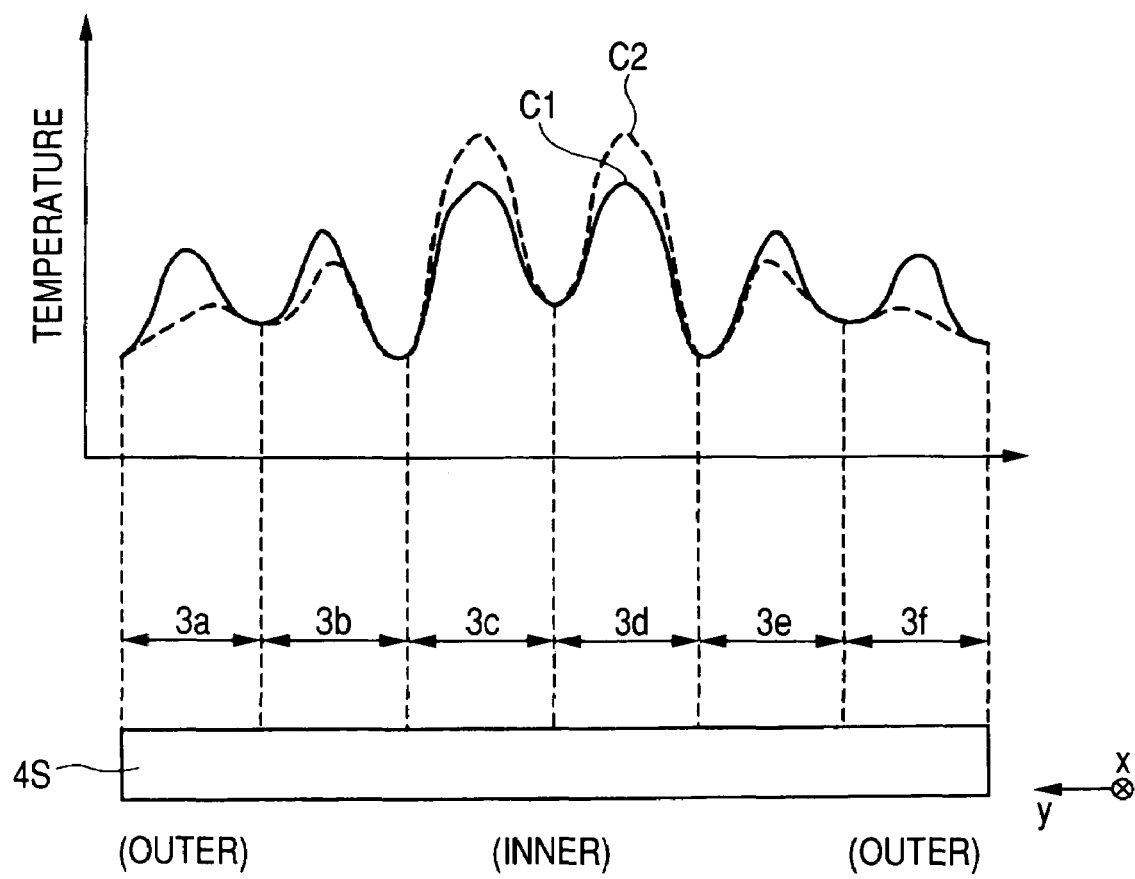
FIG. 7 is a view illustrating the semiconductor devices shown in FIGS. 3 and 6 during the operation thereof.

A description will be given herein below to the effects achieved when the present invention is applied with reference to FIGS. 3, 6, and 7. FIG. 6 is a principal-portion schematic plan view of an example of a semiconductor device examined by the present inventors, which shows a state brought about by laying out the circuit shown in FIG. 1. FIG. 7 is an illustrative view for comparison between the respective effects achieved in the cases where the present invention is applied and where the present invention is not applied, which shows the concept of a temperature distribution in the substrate 4S during the operation of the semiconductor devices in FIGS. 3 and 6 and a schematic cross section of the substrate 4S. It is to be noted that the semiconductor device (see FIG. 6) examined by the present inventors and the semiconductor device (see FIG. 3) shown in the present embodiment are substantially the same in terms of the number of the unit transistors Q to be arranged and the area of the formation region 3 but are different only in terms of the device layout.

As shown in FIG. 6, the formation region 3 of the substrate 4S is formed with thirty-six unit cells 1a, the protective elements 2a, the RF signal line 5, the DC signal line 6, the collector line 7CL, the emitter line 7EL, the pads BP, and six via holes 12. In the formation region 3, the transistor formation regions 3a, 3b, 3c, 3d, 3e, and 3f each having the plurality of unit cells 1a which are arranged with equal spacings (Dimensions L) in the x-direction are arranged in the y-direction. In short, the unit cells 1a are arranged as a matrix in the formation region 3.

On the other hand, a region 14a (hereinafter referred to as a protruding region) protruding from the formation region 3 which has a substantially rectangular plan configuration is provided such that the protective elements 2a are placed therein. The protective elements 2a are placed in the protruding region 14a.

Thus, in the device layout (see FIG. 6) of the semiconductor device examined by the present inventors, the same number (six) of the unit transistors Q are placed in each of the transistor formation regions 3a to 3f. By contrast, in the device layout (see FIG. 3) of the semiconductor device to which the present invention has been applied, the number (four) of the unit transistors Q placed in each of the inner transistor formation regions 3c and 3d of the formation region 3 is smaller than the number (seven) of the unit transistors Q placed in each of the outer transistor formation regions 3a, 3b, 3e, and 3f thereof.

Therefore, the temperature distribution C2 when the semiconductor device examined by the present inventors is operated is considered to have a peak temperature which is highest in the vicinity of the inner transistor formation regions 3c and 3d, as shown in FIG. 7. By contrast, the temperature distribution C1 when the semiconductor device shown in the present embodiment is operated is considered to have a temperature which is substantially equal throughout the transistor formation regions 3a to 3f. Accordingly, by reducing the number of the unit transistors Q placed in the inner portion of the formation region 3, a temperature increase in the inner portion of the formation region 3 can be suppressed during the operation of the semiconductor device. Specifically, when the same area is imparted to each of the respective formation regions 3 of the semiconductor device examined by the present inventors and the semiconductor device shown in the present embodiment and these semiconductor devices are operated, heat generation from the semiconductor device shown in the present embodiment can be reduced compared with heat generation from the semiconductor device examined by the present inventors. In addition, the thermal resistance of the semiconductor device shown in the present embodiment can also be reduced.

To provide a high output, an RF power amplifier module consumes high power. When a semiconductor device with a device layout as shown in FIG. 6 is used, there is a higher possibility that a large base current flows in the transistor due to thermal variations and a local temperature rise to consequently increase a collector current and cause the defect that the emitter-collector junction breaks down. However, by using the semiconductor device with a device layout as shown in FIG. 3, the degradation and breakdown of the unit transistors Q can be circumvented.

In each of the inner transistor formation regions 3c and 3d of the formation region 3, it is possible to place the unit cell 1a including the via hole 12 on the left-hand side of FIG. 3 and collectively place the protective elements 2a for the protective circuit 2 in the vacant region 14 formed on one end side (right-hand side of FIG. 3) of the formation region 3, as shown in FIG. 3. In other words, the protective elements and the like can be placed in the vacant region 14 formed by reducing the number of the unit cells 1a arranged in the inner transistor formation region 3c and 3d compared with the number of the unit cells 1a arranged in the outer portion of the formation region 3.

Because the protective elements 2a can be placed collectively in the vacant region 14, as shown in FIG. 3, the area efficiency of the layout is higher than in the case where the protective elements 2a are placed in the protruding region 14a, as shown in FIG. 6. Since the formation region 3 has a compact (rectangular) configuration, a circuit other than the amplifier circuit, such as a control circuit, can be place more easily.

The description will be given next to a method for manufacturing the semiconductor device shown in the present embodiment with reference FIGS. 8 to 13. FIGS. 8 to 13 are principal-portion schematic cross-sectional views of the semiconductor device shown in the present embodiment.

Figure 8:
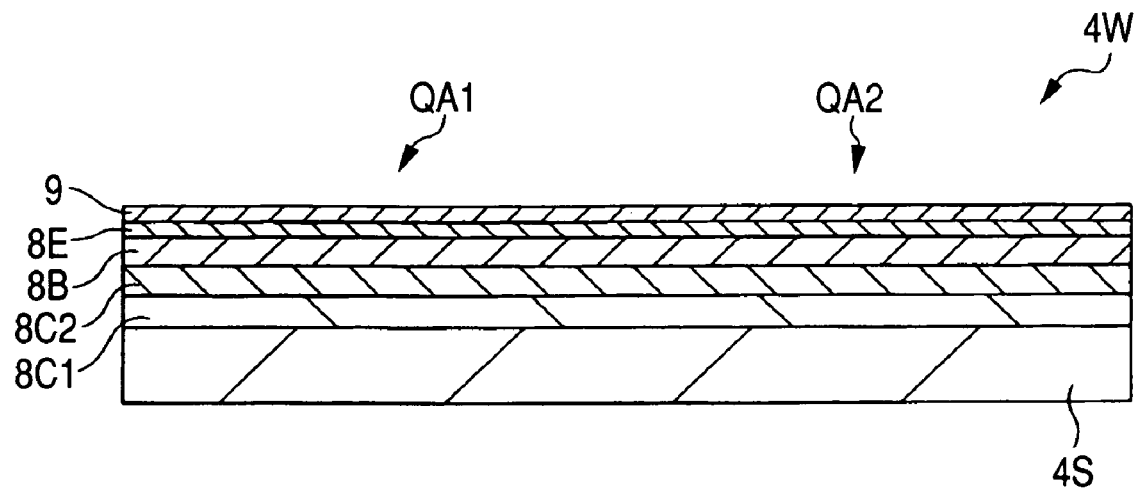
FIG. 8 is a principal-portion schematic cross-sectional view of the semiconductor device shown in Embodiment 1 in a manufacturing step therefor.

FIG. 8 is the principal-portion schematic cross-sectional view of a formation region QA1 for the amplifier circuit in the substrate 4S composing a wafer 4W having, e.g., a generally circular plan configuration and a formation region QA2 for the protective circuit therein. The substrate 4S is made of a semi-insulating compound such as, e.g., gallium arsenide (GaAs) and has a thickness of, e.g., about 80 μm. First, on the main surface (device formation surface) of the wafer 4W, the n-type sub-collector layer 8C1, the n-type collector layer 8C2, the p-type base layer 8B, the n-type emitter layer 8E, and the contact layer 9 are crystal-grown successively in an ascending order by, e.g., MOCVD (Metal Organic Chemical Vapor Deposition), gas-source MBE (Molecular Beam Epitaxy), or the like, thereby forming a hetero-junction bipolar transistor. The sub-collector layer 8C1 is composed of a compound semiconductor such as, e.g., gallium arsenide doped with an impurity such as, e.g., silicon at, e.g., about $5 \times 10^{18}$/cm$^3$ and has a thickness of, e.g., about 600 nm. The collector layer 8C2 is composed of a compound semiconductor such as, e.g., gallium arsenide doped with an impurity such as, e.g., silicon at, e.g., about $1 \times 10^{16}$/cm$^3$ and has a thickness of, e.g., about 800 nm. The base layer 8B is composed of a compound semiconductor such as, e.g., gallium arsenide doped with an impurity such as, e.g., carbon at a concentration of, e.g., about $1 \times 10^{19}$ to $1 \times 10^{20}$/cm$^3$ and has a thickness of, e.g., about 50 nm. The emitter layer 8E is composed of multiple crystal layers of, e.g., indium gallium phosphorus (InGaP) and gallium arsenide formed thereon that have been doped with an impurity such as, e.g., silicon at, e.g., about $3 \times 10^{17}$/cm$^3$ and has a total thickness of, e.g., about 230 nm. The contact layer 9 is composed of a compound semiconductor such as, e.g., indium gallium arsenide (InGaAs) and has a thickness of, e.g., about 300 nm.

Figure 9:
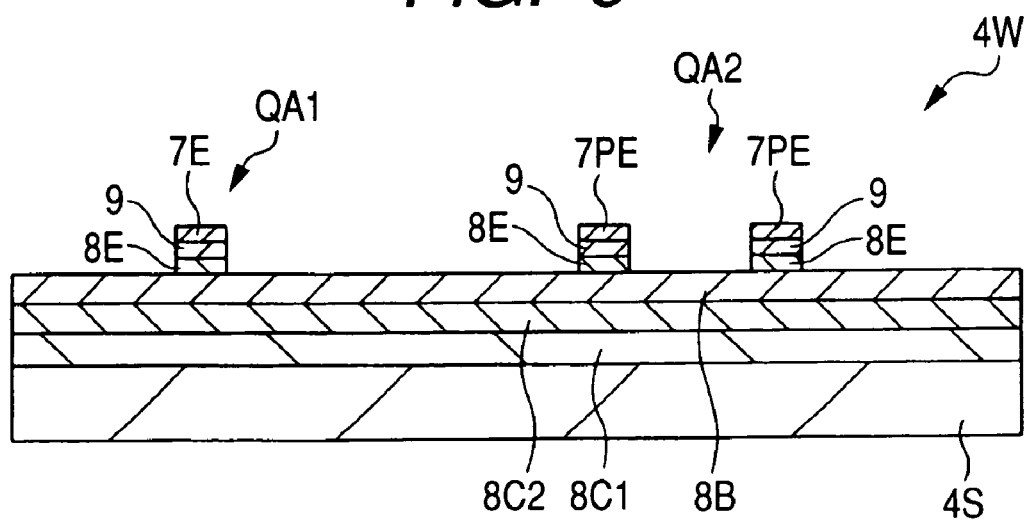
FIG. 9 is a principal-portion schematic cross-sectional view of the semiconductor device in the manufacturing step subsequent to that of FIG. 8.

Next, a silicide layer of, e.g., tungsten silicide (WSi$_x$) or the like is deposited by CVD (Chemical Vapor Deposition), sputtering, or the like on the main surface of the wafer 4W to be in contact with the contact layer 9 and then patterned by using photolithographic and dry-etching technologies to form the emitter electrode 7E for the amplifier circuit and an emitter electrode 7PE for the protective circuit in the same step, as shown in FIG. 9. In this case, a thermal processing step is unnecessary because a non-alloy ohmic contact is formed. Subsequently, the emitter layer 8E is chemically etched by using the emitter electrode 7E and 7PE as a mask to form the base layers 8B for the amplifier circuit and the protective circuit in the same step.

Figure 10:
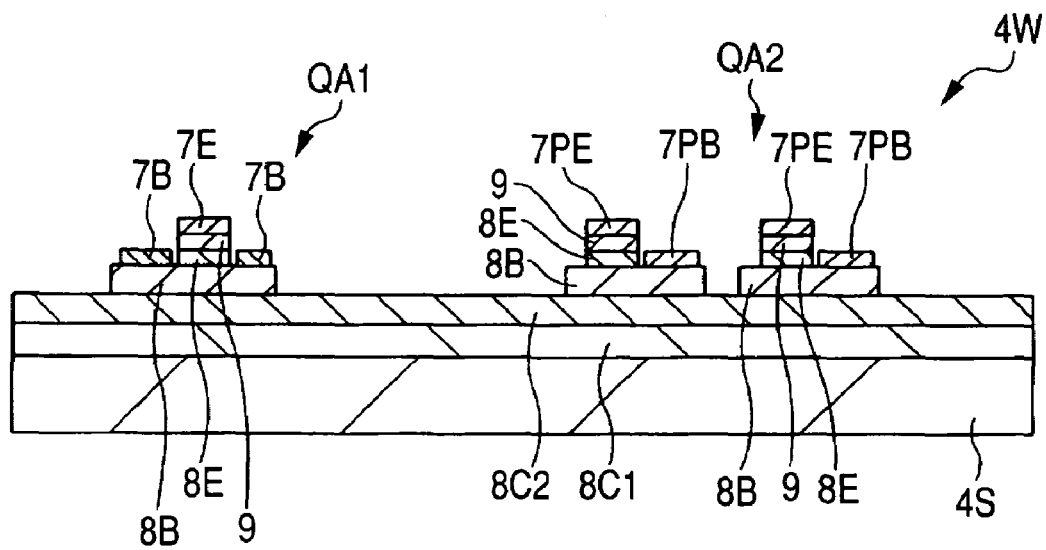
FIG. 10 is a principal-portion schematic cross-sectional view of the semiconductor device in the manufacturing step subsequent to that of FIG. 9.

Likewise, a base mesa structure is formed, as shown in FIG. 10. Thereafter, on the main surface of the wafer 4W, the base electrode 7B for the amplifier circuit and a base electrode 7PB for the protective circuit are formed by a lift-off process in the same step to be in contact with the base layer 8B. Subsequently, a thermal process is further performed to bring the base electrodes 7B and 7PB into ohmic contact with the base layer 8B. Each of the base electrodes 7B and 7PB is composed of, e.g., a platinum (Pt)/titanium (Ti)/gold (Au)-based alloy layer.

Figure 11:
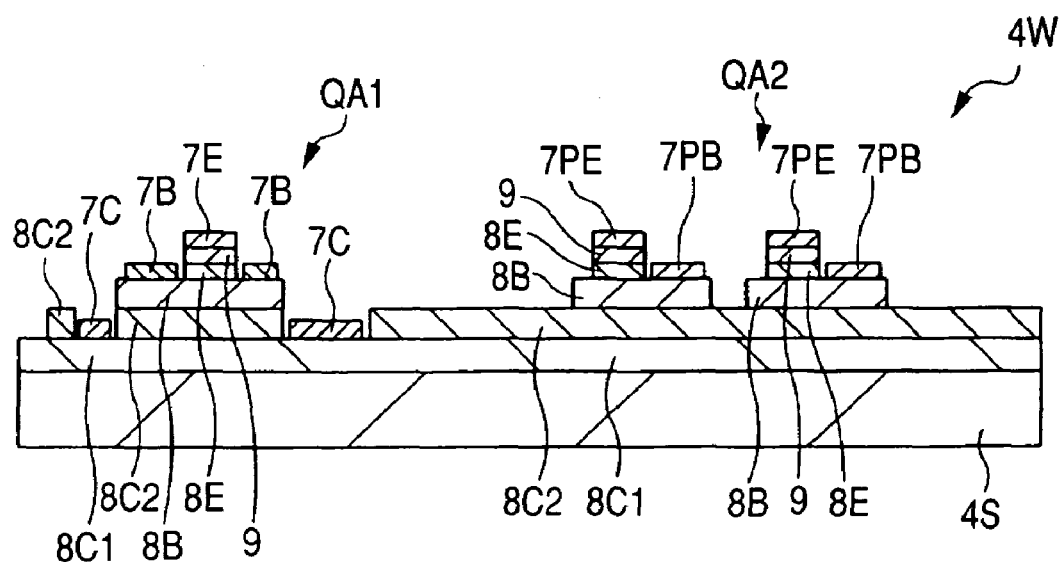
FIG. 11 is a principal-portion schematic cross-sectional view of the semiconductor device in the manufacturing step subsequent to that of FIG. 10.

Next, as shown in FIG. 11, a part of the collector layer 8C2 is removed by etching such that a part of the sub-collector layer 8C1 is exposed and the collector electrode 7C for the amplifier circuit is formed by a lift-off process or the like to be in contact with the exposed part of the sub-collector layer 8C1. The collector electrode 7C is composed of, e.g., a gold-germanium (AuGe)/nickel (Ni)/gold (Au)-based alloy layer.

Figure 12:
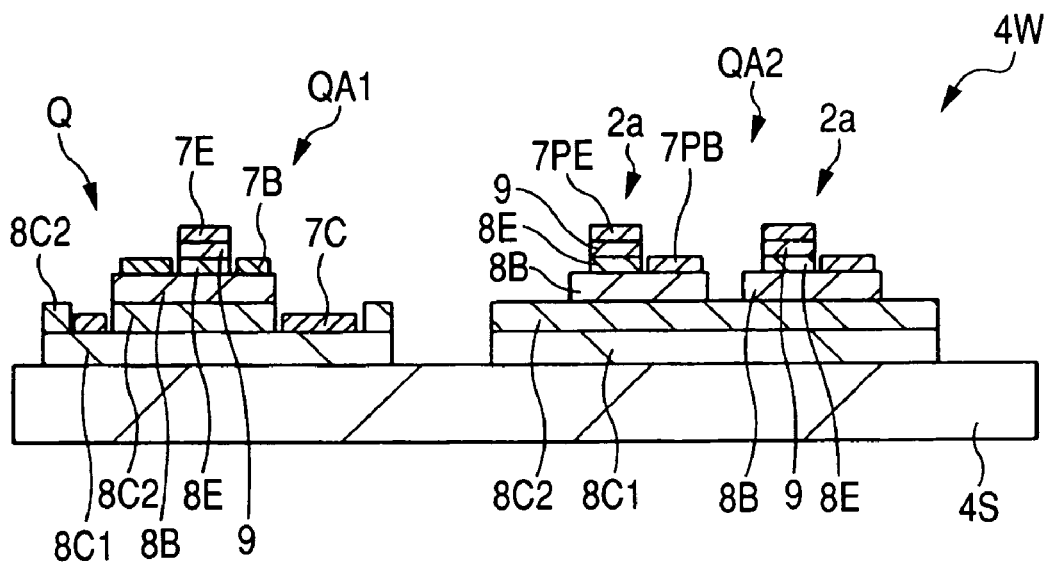
FIG. 12 is a principal-portion schematic cross-sectional view of the semiconductor device in the manufacturing step subsequent to that of FIG. 11.

Next, as shown in FIG. 12, a part of each of the collector layer 8C2 and the sub-collector layer 8C1 is etched away by using photolithographic and chemical-etching technologies to form a collector mesa structure. As a result, the formation region QA1 for the amplifier circuit and the formation region QA2 for the protective circuit are separated from each other. In the formation region QA2 for the protective circuit, the sub-collector layer 8C1 and the collector layer 8C2 are left to allow the sharing of the collector region, i.e., to provide electrical connection between the respective collectors of the two protective elements 2a. In this manner, the unit transistors Q for the amplifier circuit 1 and the protective elements 2a of the protective circuit 2 are formed on the main surface of the wafer 4W. In the present embodiment, the unit transistors Q and the protective elements 2a can be formed simultaneously in the same process. This allows a reduction in the number of the steps and thereby allows reductions in the manufacturing time and cost of the semiconductor device.

Figure 13:
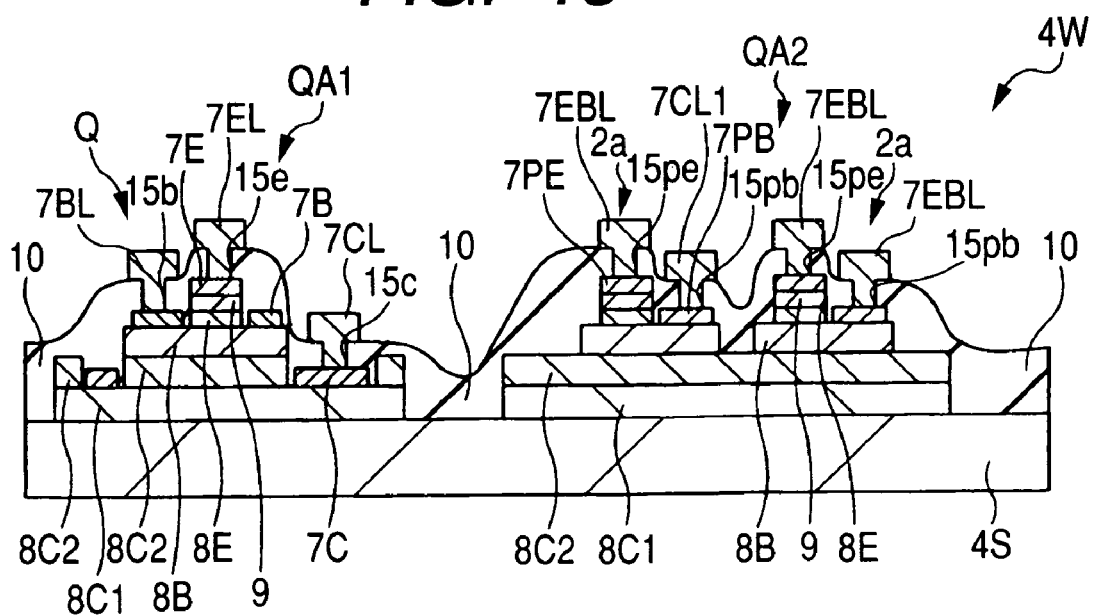
FIG. 13 is a principal-portion schematic cross-sectional view of the semiconductor device in the manufacturing step subsequent to that of FIG. 12.

Next, as shown in FIG. 13, the insulating film 10 made of, e.g., silicon oxide (SiO$_x$) or the like is deposited by CVD on the main surface of the wafer 4W. The insulating film 10 is then formed with contact holes 15*e*, 15*pe*, 15*b*, 15*pb*, and 15*c* reaching the emitter electrodes 7E and 7PE, the base electrodes 7B and 7PB, and the collector electrode 7C through a photoresist process, a dry etching process, and a chemical etching process. Subsequently, a molybdenum (Mo) layer, a gold (Au) layer, and a molybdenum layer, e.g., are deposited successively in an ascending order on the main surface of the wafer 4W by vapor deposition or sputtering and then patterned by using a photoresist process and a dry etching process to form the collector line 7CL, the emitter line 7EL, the base line 7BL, and a line 7EBL. Although the single-layer wiring structure is shown herein by way of example, it is also possible to provide a multilayer wiring structure by stacking insulating layers and wiring layers and form a necessary circuit pattern by the same steps.

On the other hand, as shown in FIG. 13, the n-type sub-collector layer 8CL, the n-type collector layer 8C2, the p-type base layers 8B, the n-type emitter layers 8E, and the contact layers 9 are formed in this order on the substrate 4S to provide the protective elements 2*a*. The emitter electrodes 7PE are formed on the contact layers 9, while the base electrodes 7PB are formed on the base layers 8B. The respective collectors of the protective elements 2*a* are electrically connected to each other by sharing the sub-collector layer 8C1 and the collector layer 8C2. The protective elements 2*a* and the unit transistors Q are arranged in a state mutually insulated by the insulating films 10.

Although the present embodiment has shown the InGaP/GaAs HBT using gallium arsenide for the base layer 8B and indium gallium phosphorus (InGaP) for the emitter layer 8E by way of example, the present invention is not limited thereto and various changes and modifications can be made therein. The present invention is also applicable to the case of adopting, e.g., an AlGaAs/GaAs HBT using gallium arsenide for the base layer 8B and aluminum gallium arsenide (AlGaAs) for the emitter layer 8E, an InAlAs/InGaAs HBT using indium gallium arsenide for the base layer 8B and indium aluminum arsenide (InAlAs) for the emitter layer 8E, or a SiGe/Si HBT using silicon germanium (SiGe) for the base layer 8B and silicon for the emitter layer 8E. Although the present embodiment has described the case where the GaAs substrate is used as the substrate, it is also possible to use an InP-based substrate, a SiGe substrate, a Si substrate, or a SOI (Silicon On Insulator) substrate.

Embodiment 2

A semiconductor device shown in Embodiment 2 will be described with reference to FIGS. 14 and 15. In contrast to Embodiment 1 which has described the case where the HBT is used, the present embodiment will describe the case where a MOS (Metal Oxide Semiconductor) transistor is used.

Figure 14:
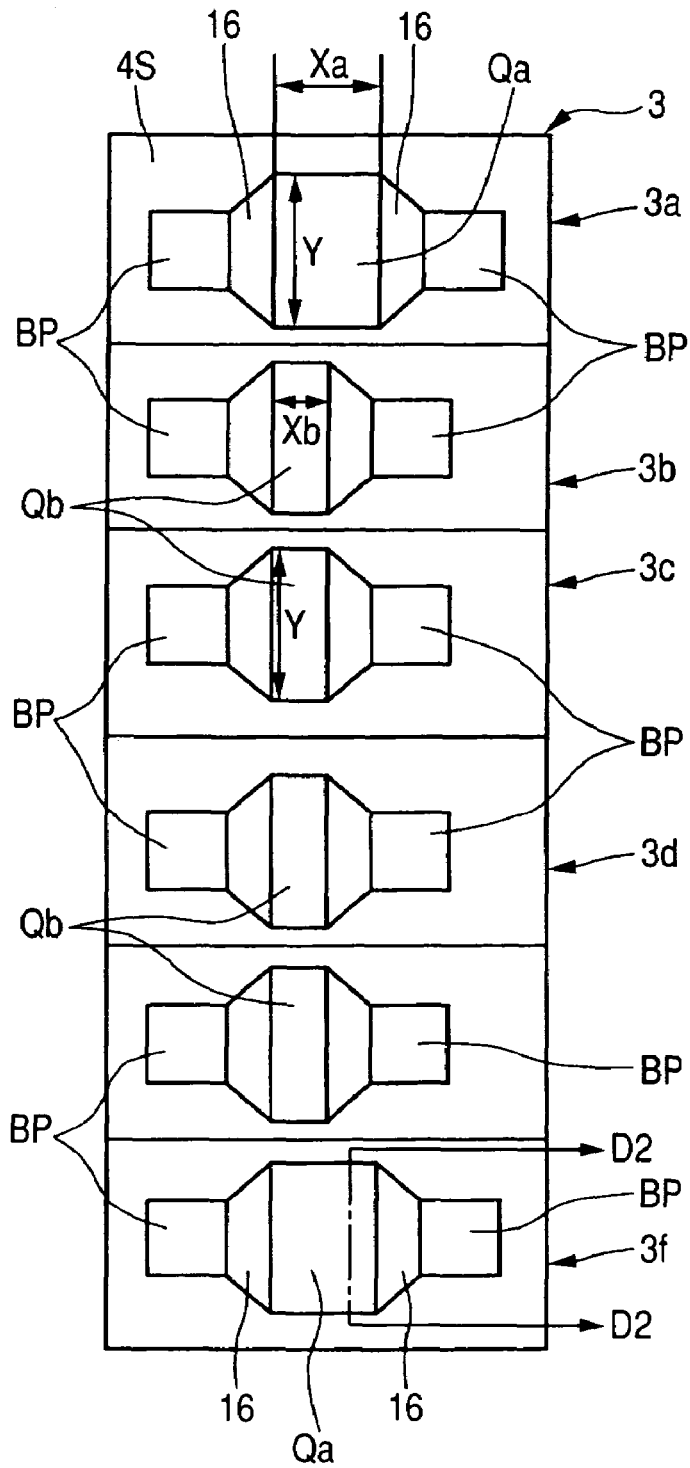
FIG. 14 is a principal-portion schematic plan view of a semiconductor device shown in Embodiment 2 of the present invention.
Figure 15:
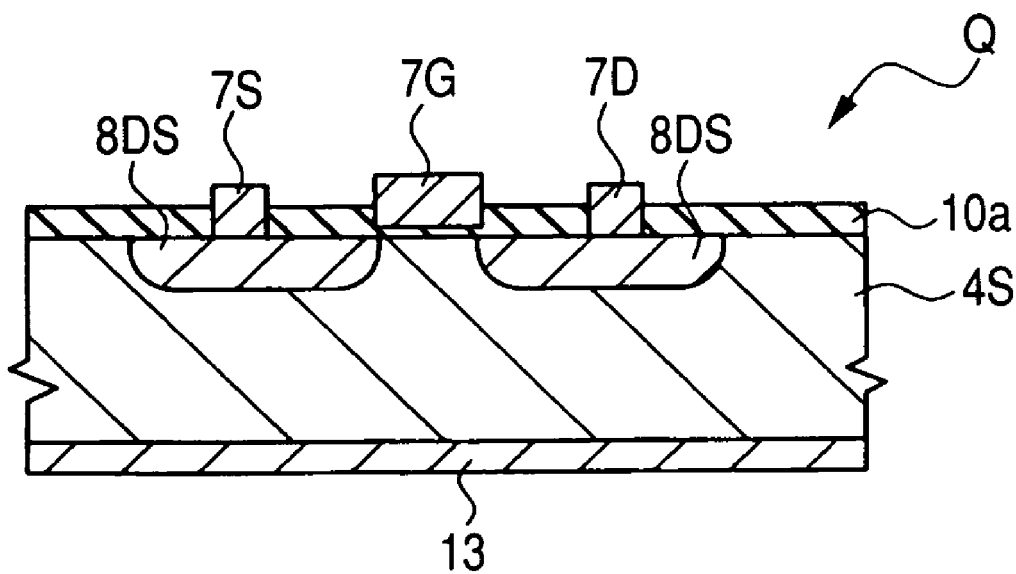
FIG. 15 is a principal-portion schematic cross-sectional view of the semiconductor device taken along the line D2-D2 of FIG. 14.
Figure 15:
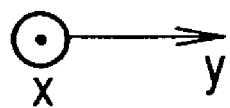

FIG. 14 is a principal-portion schematic plan view of the semiconductor device shown in the present embodiment. FIG. 15 is a principal-portion schematic plan view of the semiconductor device taken along the line D2-D2 of FIG. 14.

As shown in FIG. 14, MOS transistors Qa and Qb, the pads BP, and wiring patterns 16 providing electrical connection therebetween have been laid out in the formation region 3 of the substrate 4S. The formation region 3 is provided with a plurality of transistor formation regions 3*a* and 3*f* having the MOS transistors Qa and a plurality of transistor formation regions 3*b*, 3*c*, 3*d*, and 3*e* having the MOS transistors Qb, which are arranged in the y-direction.

Each of the MOS transistors Qa is formed to have a plan configuration of a dimension Xa in the x-direction and a dimension Y in the y-direction. In this case, the dimension Xa corresponds to the gate width of the MOS transistor Qa. In the region of the dimensions Xa×Y, the plurality of unit transistors Q each having a gate 7G, a source 7S, and a drain 7D are formed equispacedly in stripes in the y-direction, as shown in FIG. 15. In FIG. 15, the reference numerals 8DS, 10*a*, and 13 denote a diffusion layer, an insulating film, and the back-surface electrode.

Likewise, each of the MOS transistors Qb is formed to have a plan configuration of a dimension Xb in the x-direction and a dimension Y in the y-direction. In this case, the dimension Xb corresponds to the gate width of the MOS transistor. In the region of the dimensions Xb×Y, the plurality of unit transistors Q shown in FIG. 15 are formed equispacedly in stripes in the y-direction.

If it is assumed that Dimension Xa>Dimension Xb is satisfied, the area of the active region of the MOS transistor Qb becomes smaller than the area of the active region of the MOS transistor Qa. Accordingly, the inner region of the formation region 3, e.g., the active region of each of the transistors placed in the transistor formation regions 3*c* has an area smaller than the area of the outer region of the formation region 3, e.g., the active region of each of the transistors placed in the transistor formation region 3*a*. This allows the suppression of a temperature rise in the inner portion of the formation region 3.

In the device layout of the semiconductor device shown in the present embodiment, the area of the active region of each of the MOS transistors Qb placed in the inner portion of the formation region 3 is smaller than the area of the active region of each of the MOS transistors Qa placed in the outer portion thereof. Therefore, it can be considered that the temperatures of the transistor formation regions 3*a* to 3*f* become approximately equal when the semiconductor device is operated. This allows a reduction in the thermal resistance of the semiconductor device.

Embodiment 3

Figure 16:
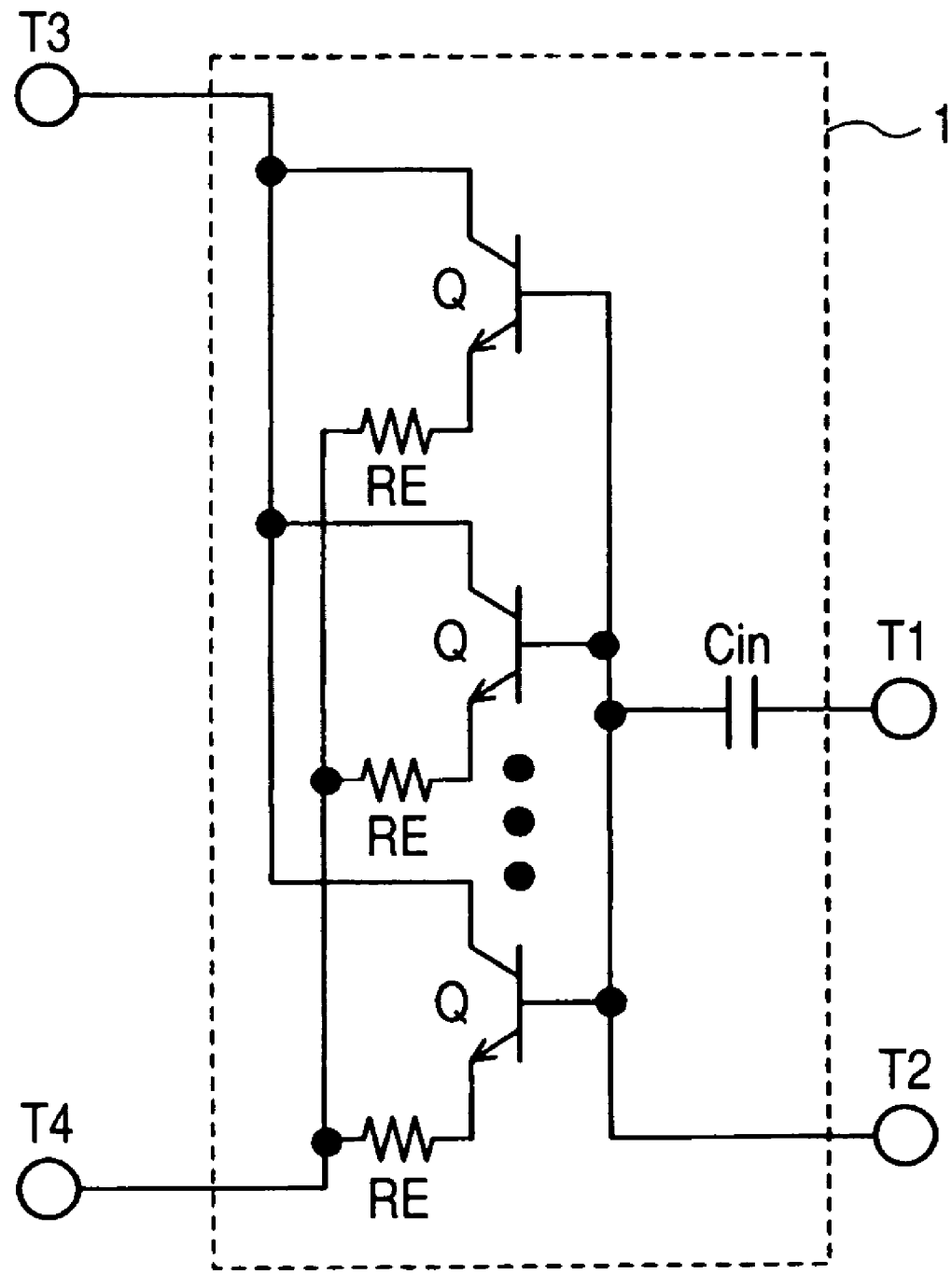
FIG. 16 is a circuit diagram of an output circuit formed in a semiconductor device shown in Embodiment 3 of the present invention.

A semiconductor device shown in Embodiment 3 will be described with reference to FIGS. 16 to 24. The description will be given first to the amplifier circuit of the semiconductor device shown in the present embodiment with reference to FIG. 16. FIG. 16 is a circuit diagram of the amplifier circuit 1 shown in the present embodiment.

As shown in FIG. 16, the amplifier circuit 1 is composed of the plurality of unit transistors Q connected in parallel. The plurality of unit transistors Q have the respective collectors coupled to each other, the respective emitters coupled to each other, and the respective bases coupled to each other. As a result, the amplifier circuit is constituted to operate as though it is a single transistor with the common RF signal inputted to the input-side bases from the terminal T1. On the output side of the amplifier circuit 1, the unit transistors Q have the respective collectors connected commonly to the terminal T3 and the respective emitters connected commonly to the terminal T4. In each of the emitters of the plurality of unit transistors Q, an emitter ballast resistor RE is inserted on a one-by-one basis.

In the case where the amplifier circuit 1 shown in FIG. 16 is provided, when current localization to a specified one of the unit transistors Q is about to occur, the emitter base ballast resistor RE causes the collector-to-emitter voltage to drop, thereby suppressing an increase in collector current and the thermal runaway.

Compared with the amplifier 1 of FIG. 1 shown above in Embodiment 1, the present embodiment has inserted a single common capacitor Cin between the terminal T1 and each of the unit transistors Q, in contrast to Embodiment 1 which has inserted the individual capacitors Cin between the respective bases of the unit transistors Q and the terminal T1, as described above. In contrast to Embodiment 1 which has inserted the protective circuit 2 between the terminals T3 and T4 of each of the unit transistors Q, the present embodiment has not inserted such a protective circuit. The reason for thus successfully providing only the single common capacitor Cin and omitting the insertion of the protective circuit in the amplifier circuit 1 shown in the present embodiment is that the HBT used as each of the unit transistors Q has a different structure.

Figure 17:
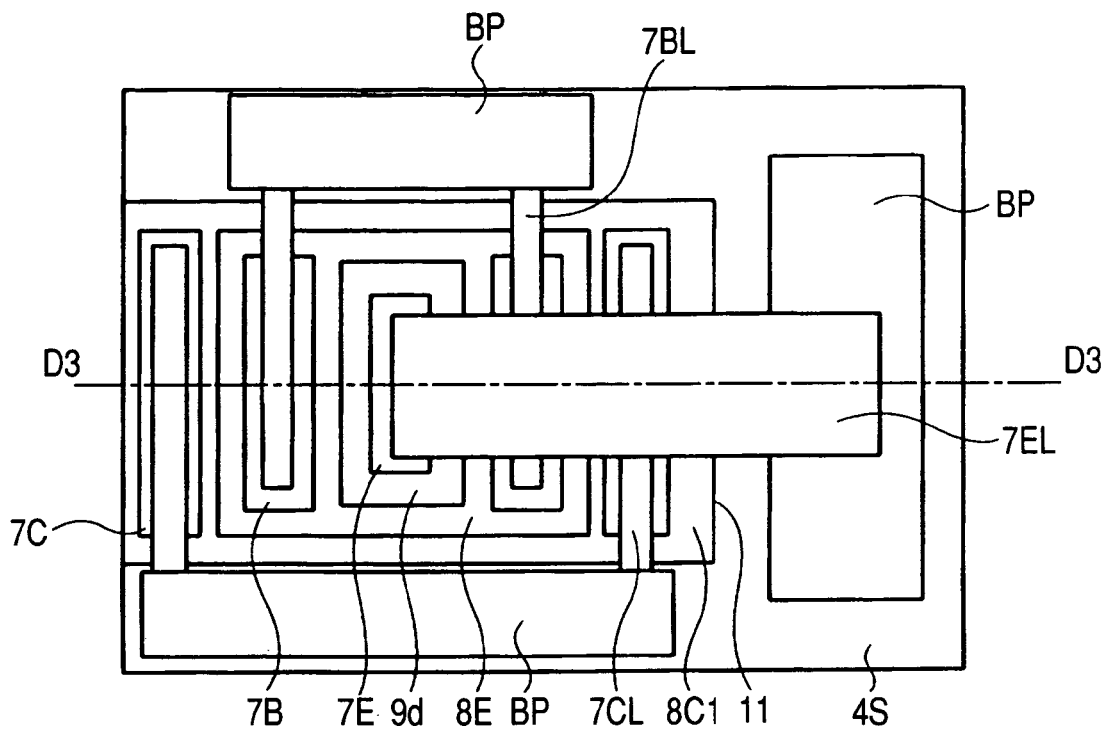
FIG. 17 is a schematic plan view of a HBT shown in Embodiment 3.
Figure 18:
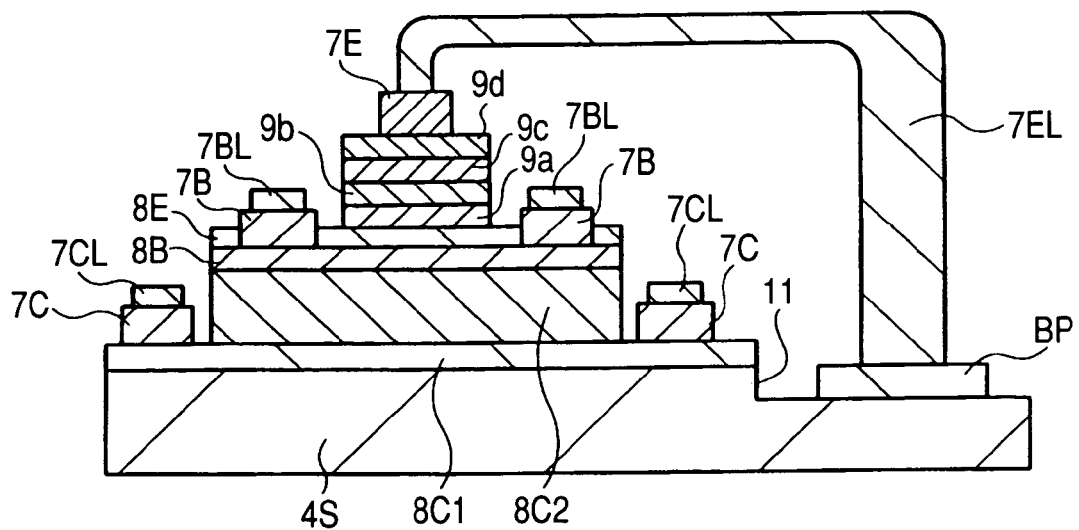
FIG. 18 is a schematic cross-sectional view of the HBT taken along the line D3-D3 of FIG. 17.

A description will be given to the HBT according to the present embodiment with reference to FIGS. 17 and 18. FIG. 17 is a schematic plan view of the HBT according to the present embodiment. FIG. 18 shows a cross-sectional view thereof taken along the line D3-D3 of FIG. 17. The emitter occupies an area of 108 μm². It is sufficient to use general-purpose components for the principal components of the HBT shown in the present embodiment except for the emitter layer, GaAs layer, and ballast resistor layer of the HBT described above in Embodiment 1. A method for manufacturing the HBT shown in the present embodiment is substantially the same as the method for manufacturing the HBT shown above in Embodiment 1.

The n-type GaAs sub-collector layer (with a Si concentration of $5 \times 10^{18}$ cm$^{-3}$ and a film thickness of 0.6 μm) 8C1 is formed on the substrate 4S made of semi-insulating GaAs. On the sub-collector layer 8C1, there are formed the n-type GaAs collector layer (with a Si concentration of $1 \times 10^{16}$ cm$^{-3}$ and a film thickness of 1.0 μm) 8C2, the p-type GaAs base layer (with a C concentration of $4 \times 10^{19}$ cm$^{-3}$ and a film thickness of 150 nm) 8B, and the n-type InGaP emitter layer (with an InP molar ratio of 0.5, a Si concentration of $3 \times 10^{17}$ cm$^{-3}$, and a film thickness of 30 nm) 8E. The base electrode 7B is placed via the emitter layer 8E.

On the other hand, the emitter layer 8E is further provided with an n-type GaAs semiconductor layer (with a Si concentration of $3 \times 10^{17}$ cm$^{-3}$ and a film thickness of 90 nm) 9a, an n-type AlGaAs emitter ballast resistor layer (with an AlAs molar ratio of 0.33, a Si concentration of $1 \times 10^{17}$ cm$^{-3}$, and a film thickness of 120 nm) 9b, an n-type GaAs contact layer (with a Si concentration of $1 \times 10^{19}$ cm$^{-3}$ and a film thickness of 50 nm) 9c, and an InGaAs contact layer (with an InAs molar ratio of 0.5, a Si concentration of $1 \times 10^{19}$ cm$^{-3}$, and a film thickness of 50 nm) 9d.

In a structure having, e.g., the emitter ballast resistor layer 9b composed of the n-type AlGaAs layer, the semiconductor layer 9a composed of the n-type GaAs layer, and the emitter layer 8E composed of the n-type InGaP layer, the emitter ballast resistor layer 9b is a semiconductor layer having a resistivity higher than that of the semiconductor layer 9a composed of the n-type GaAs layer. The emitter ballast resistor layer 9b corresponds to the emitter ballast resistor RE shown in FIG. 16.

Then, the emitter electrode 7E is provided on the contact layer 9d. On the other hand, the collector electrode 7C is formed to oppose the both side portions of the collector layer 8C2 on the sub-collector layer 8C1. As shown in FIG. 17, the collector region surrounds the emitter region in a plan configuration according to the present embodiment.

In a specific example, the collector electrode 7C is composed of AuGe (with a film thickness of 60 nm), Ni (with a film thickness of 10 nm), and Au (with a film thickness of 200 nm) which are stacked in layers, the base electrode 7B is composed of Ti (with a film thickness of 50 nm), Pt (with a film thickness of 50 nm), and Au (with a film thickness of 200 nm) which are stacked in layers, and the emitter electrode 7E is composed of WSi (with a Si molar ratio of 0.3 and a film thickness of 0.3 μm). In FIG. 17, the reference numerals 7CL, 7BL, and 7EL denote a collector line, a base line, and an emitter line, respectively, the reference mark BP denotes a pad for electrical connection with the outside of the HBT, and the reference numeral 11 denotes an isolation trench.

As a result of performing a 300 hour burn-in test (power-on test) with respect to twenty HBTs each having the AlGaAs emitter ballast layer 9b shown in the present embodiment under such conditions that the collector current density was 40 kA/cm² and the junction temperature was 210° C., there was no degraded HBT and excellent reliability under the powered condition was proved. As a result of performing the same test with respect to a HBT (e.g., the HBT of FIG. 5 shown above in Embodiment 1) having the same structure as each of the HBTs tested above except for the absence of the AlGaAs emitter ballast resistor layer, excellent reliability under the powered condition could not be proved.

In contrast to Embodiment 1 described above in which the capacitors Cin are connected to the individual HBTs (unit transistors Q) on a one-by-one basis as shown in FIG. 1, the use of the structure having the AlGaAs emitter ballast resistor layer 9b shown in the present embodiment provides a structure in which the resistor component formed in the emitter suppresses current localization to an arbitrary one of the HBTs and non-uniform operations are difficult without rendering the base potentials independent of each other. This allows the formation of a structure with the single common capacitor Cin as shown in FIG. 16 and also obviates the necessity to provide a protective circuit on the output side of the amplifier circuit.

Figure 19:
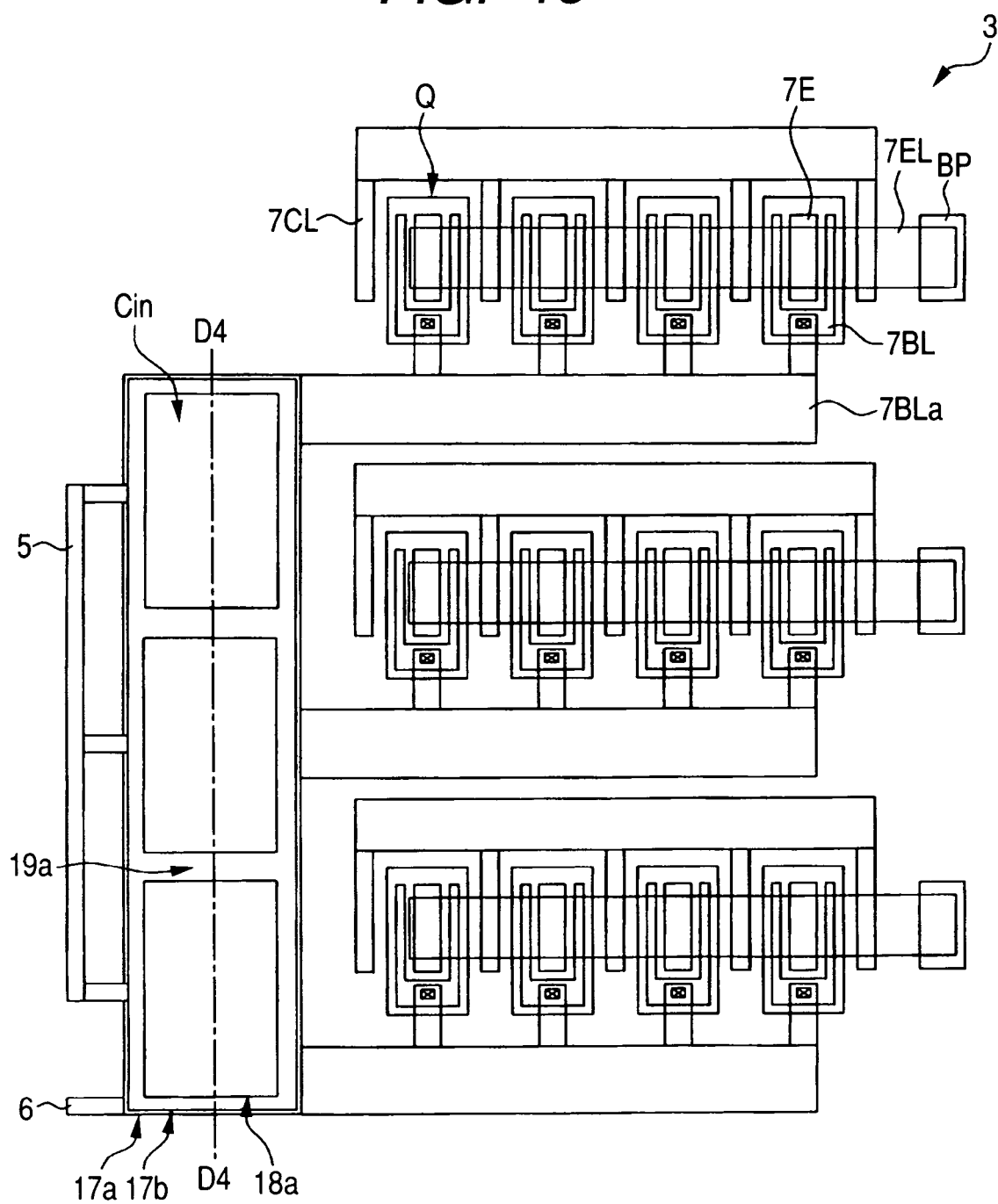
FIG. 19 is a principal-portion schematic plan view of the semiconductor device shown in Embodiment 3.
Figure 20:
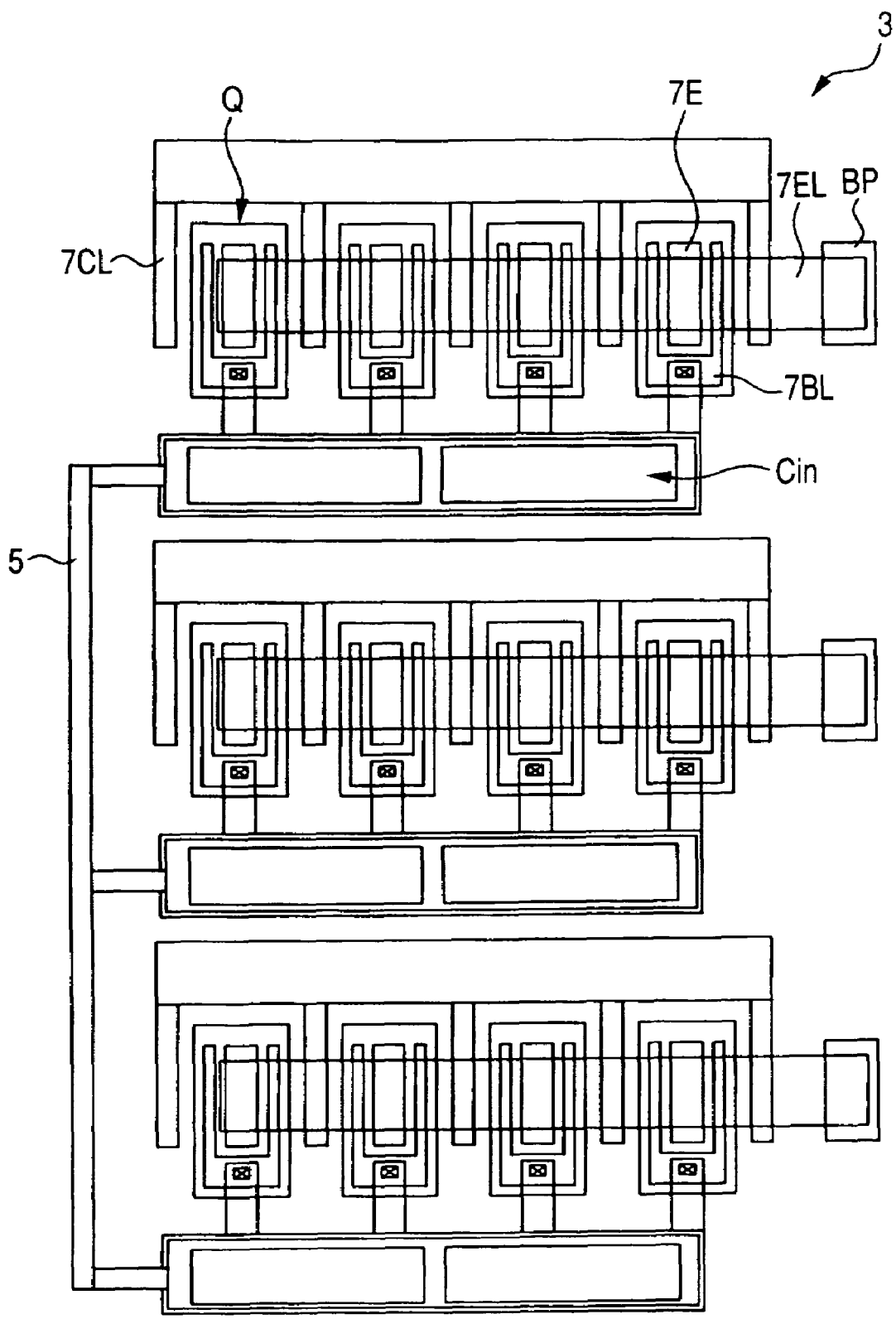
FIG. 20 is a principal-portion schematic plan view of a variation of the semiconductor device shown in FIG. 19.
Figure 21:
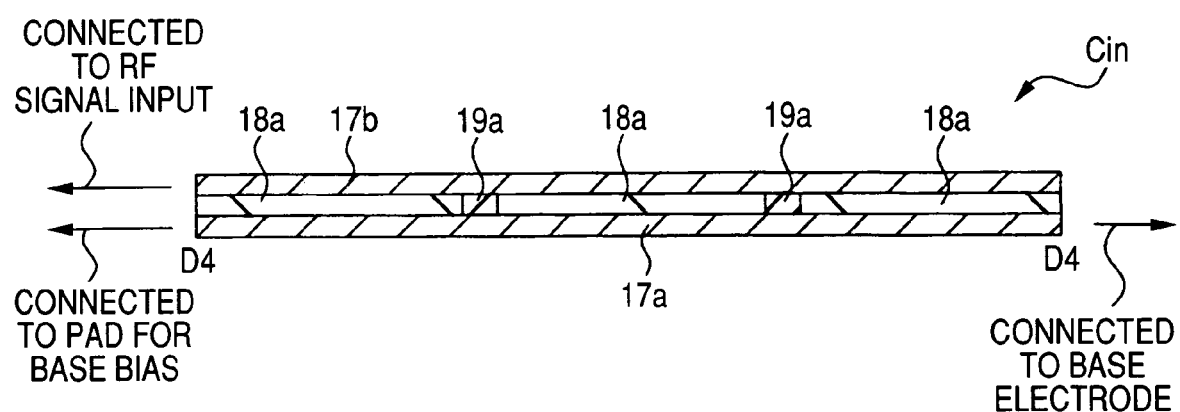
FIG. 21 is a schematic cross-sectional view of a capacitor taken along the line D4-D4 of FIG. 19.
Figure 22:
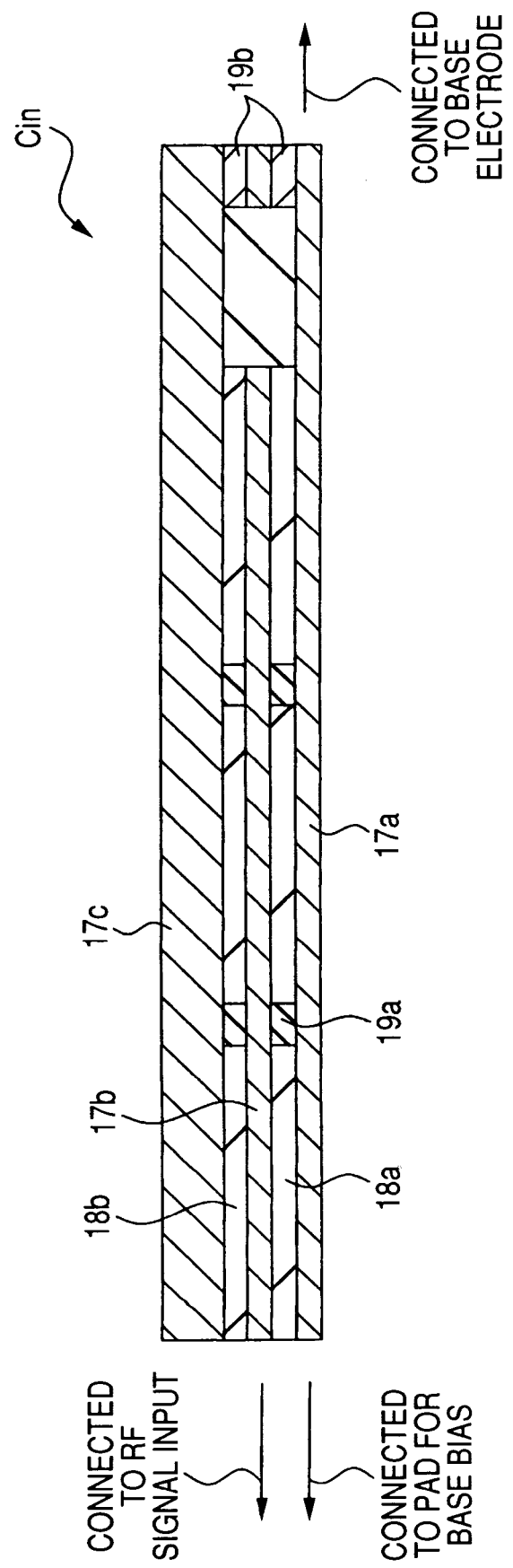
FIG. 22 is a schematic cross-sectional view of a variation of the capacitor shown in FIG. 21.

The description will be given next to the device layout of the semiconductor device shown in the present embodiment with reference to FIGS. 19 to 22. FIG. 19 is a principal-portion schematic plan view of the semiconductor device having the amplifier circuit shown in FIG. 16. FIG. 20 is a principal-portion schematic plan view of a semiconductor device as a variation of the semiconductor device of FIG. 19. FIG. 21 is a schematic cross-sectional view of the input capacitor taken along the line D4-D4 of FIG. 19. FIG. 22 is a schematic cross-sectional view of a variation of the capacitor shown in FIG. 21.

As shown in FIG. 19, the unit transistors Q are connected in parallel in the formation region 3. In the internal layout of the formation region 3 has only one capacitor Cin placed therein which is connected to the RF signal line 5 and to a common base line 7BLa combining the base lines 7BLa. The provision of such a layout has been allowed by the use of the HBTs comprising the emitter ballast resistor layers 9b for the unit transistors Q, as described above. Even in the device layout in which the only one capacitor Cin has been connected, as shown in FIG. 19, the non-uniform operations of the unit transistors Q are suppressed. That is, since the use of the HBTs comprising the emitter ballast resistor layers 9b has increased the resistance to the breakdown and thermal runaway resulting from the non-uniform operations compared with that of HBTs without emitter ballast resistors, the single common capacitor Cin can be connected sufficiently to the RF signal line 5 without inserting the capacitor elements in the individual unit transistors on a one-by-one basis.

As shown in FIG. 20, the layout may also be such that the capacitors Cin are disposed on the base lines 7BLa. In FIG. 20, one capacitor Cin is disposed for four unit transistors Q so that the respective lower electrodes of the individual capacitors Cin are electrically independent of each other. Accordingly, it does not follow that only one capacitor is shared in the formation region 3 but, by disposing the capacitors Cin on the base lines 7BLa, the size of the formation region 3 can be reduced compared with the formation region 3 of FIG. 19.

As shown in FIG. 21, the capacitor Cin has a single-layer structure comprised of an electrode (lower electrode) 17a made of, e.g., gold (Au), a capacitor film 18a composed of, e.g., a nitride film or an oxide film, and an electrode (upper electrode) 17b made of, e.g., Au. In the case where each of the capacitors Cin occupies a large area which is 200 μm square or more, there is the possibility that a crack occurs in the capacitor film 18a under the influence of an ambient stress so that the capacitor film 18a shown in FIG. 21 has been divided into a plurality of parts. Between the divided parts of the capacitor film 18a, interlayer insulating films 19a composed of, e.g., an oxide film have been formed.

In the present embodiment, the base lines 7BLa and the electrodes 17a of the capacitors Cin are formed from the same common layer and electrically connected to the pads for base bias. On the other hand, the RF signal line 5 and the electrodes 17b of the capacitors Cin are formed from the same common layer. By thus forming the electrodes 17a of the capacitors Cin and the base lines 7BL from the same common layer and forming the electrodes 17b of the capacitors Cin and the RF signal line 5 from the same common layer, the area of the formation region 3 can be reduced.

As shown in FIG. 22, each of the capacitors Cin may also have, e.g., a double-layer stacked structure. The capacitor Cin has the electrode 17a made of, e.g., Au, the capacitor film 18a composed of, e.g., a nitride film or an oxide film, the electrode 17b made of, e.g., Au, a capacitor film 18b composed of, e.g., a nitride film or an oxide film, and an electrode 17c made of, e.g., Au. The reference numeral 19a denotes an interlayer insulating film and the reference numeral 19b denotes a contact between the electrodes 17a and 17b or a contact between the electrodes 17b and 17c.

Embodiment 4

Figure 23:
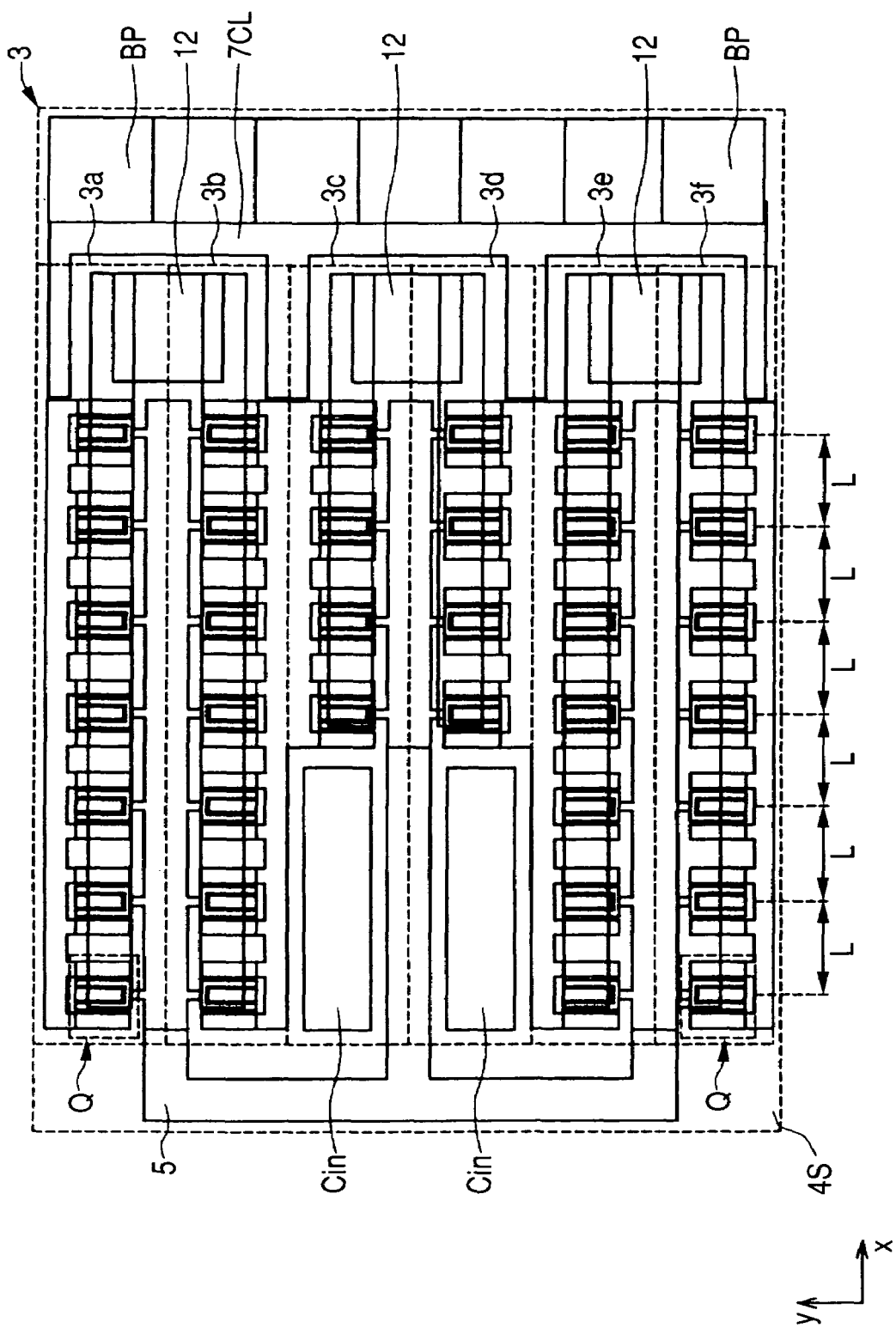
FIG. 23 is a principal-portion schematic plan view of a semiconductor device shown in Embodiment 4 of the present invention.
Figure 24:
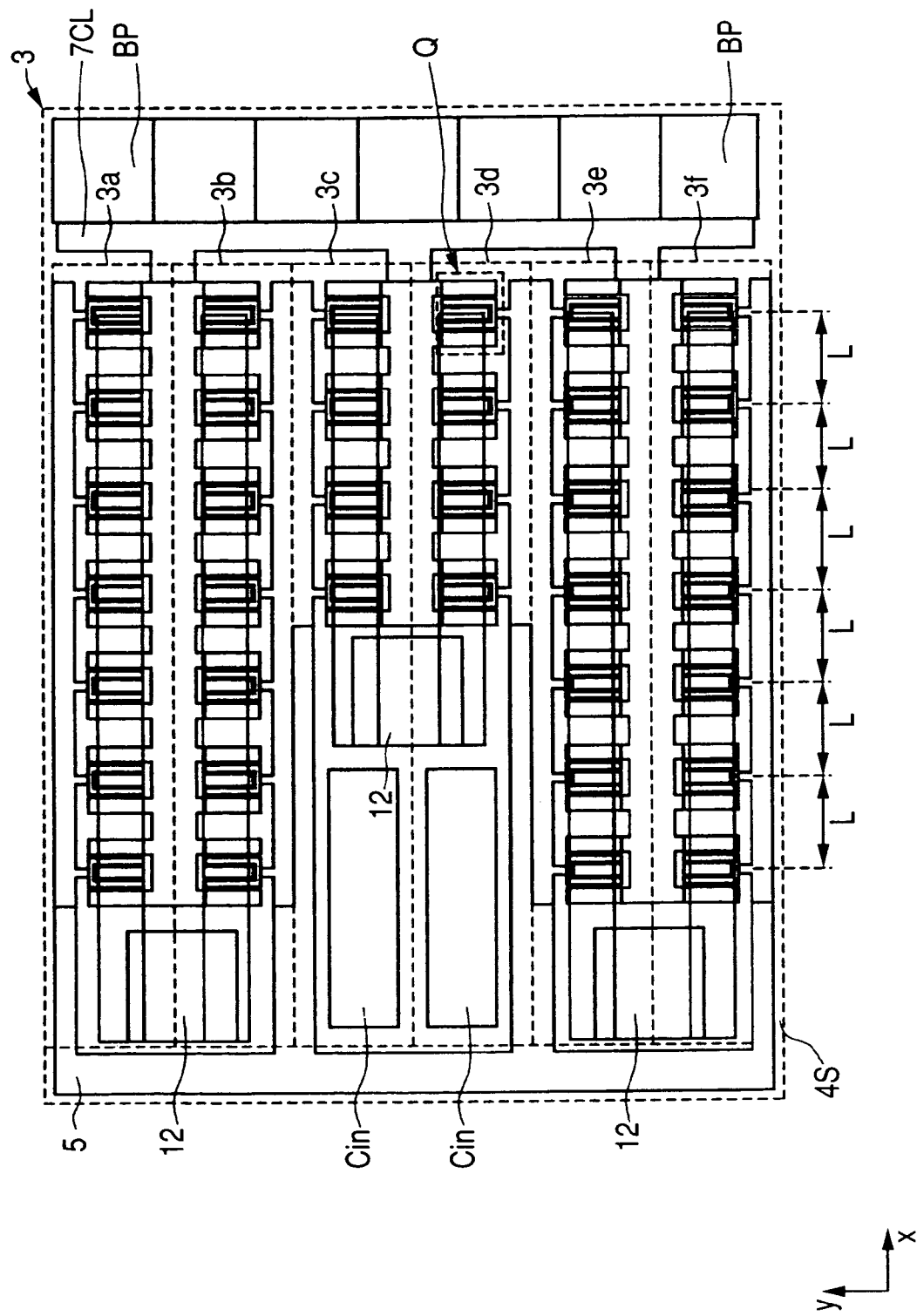
FIG. 24 is a principal-portion schematic plan view of a variation of the semiconductor device shown in FIG. 23.

A semiconductor device shown in Embodiment 4 will be described with reference to FIGS. 23 and 24. The present embodiment will describe a device layout in which the number of the transistors in the inner transistor formation regions of the formation region described above in Embodiment 1 is smaller than that of the transistors in the outer transistor formation regions thereof by using the HBTs having the emitter ballast resistor layers shown above in Embodiment 3. FIG. 23 is a principal-portion schematic plan view of an example of the semiconductor device shown in the present embodiment. FIG. 24 is a principal-portion schematic plan view of another example of the semiconductor device shown in the present embodiment.

As shown in FIG. 23, the formation region 3 of the substrate 4S is formed with thirty-six unit transistors Q, the capacitors Cin, the RF signal line 5, the DC signal line 6, the collector line 7CL, the pads BP, and three via holes 12. The formation region 3 is provided with the plurality of transistor formation regions 3a, 3b, 3c, 3d, 3e, and 3f which are arranged in the y-direction. Each of the transistor formation regions 3a, 3b, 3c, 3d, 3e, and 3f has the plurality of unit transistors Q arranged with equal spacings (Dimensions L) in the x-direction to form a row.

In each of the transistor formation regions 3a and 3b of the formation region 3, seven unit transistors Q are arranged together with the single via hole 12 in the x-direction. The via hole 12 is located on one end (right end of FIG. 23) of each of the transistor formation regions 3a and 3b. In contrast to Embodiment 1 described above which has formed the via holes substantially in the middle of the plurality of unit transistors to lower the highest temperature in each of the transistor formation regions that has resulting from heat generation from the transistors to dissipate heat, the present embodiment can locate the via holes 12 on the side with the respective one ends of the transistor formation regions 3a and 3b since it uses the HBTs having the emitter ballast resistor layers shown above in Embodiment 3 for the unit transistors Q.

On the other hand, in each of the inner regions of the formation region 3, i.e., the transistor formation regions 3c and 3d sandwiched between the transistor formation regions 3a and 3b and the transistor formation regions 3e and 3f, four unit transistors Q are arranged together with one via hole 12 in the x-direction on one end side thereof.

In the present embodiment, the plurality of transistor formation regions 3a to 3f each including the unit transistors Q which are arranged equispacedly in a row are arranged in the formation region 3 and the number (four) of the transistors placed in each of the inner transistor formation regions 3c and 3d of the formation region 3 is smaller than the number (seven) of the transistors placed in each of the outer transistor formation regions 3a, 3b, 3e, and 3f of the formation region 3. By thus reducing the number of the transistors placed in the inner portion of the formation region 3, it becomes possible to suppress a temperature rise in the inner portion of the formation region 3.

In addition, the use of the HBTs having the emitter ballast resistor layers shown above in Embodiment 3 for the unit transistors Q obviates the necessity to connect the capacitors to the respective bases of the individual unit transistors on a one-by-one basis as shown above in Embodiment 1 and further connect a protective circuit, thereby allowing the size reduction of the formation region 3.

The use the HBTs having the emitter ballast resistors shown above in Embodiment 3 also allows the formation of a device layout as shown in FIG. 24. That is, the via hole 12 located on one end side (right-hand side of FIG. 23) of each of the transistor formation regions 3a to 3f in FIG. 23 can also be located on the other end side (left-hand side of FIG. 24) of each of the transistor formation regions 3a to 3f.

Embodiment 5

A radio communication device shown in Embodiment 5 will be described with reference to FIGS. 25 and 29. The present embodiment will describe the radio communication device comprising the semiconductor device using the HBTs for the unit transistors shown in the embodiments described above.

Figure 25:
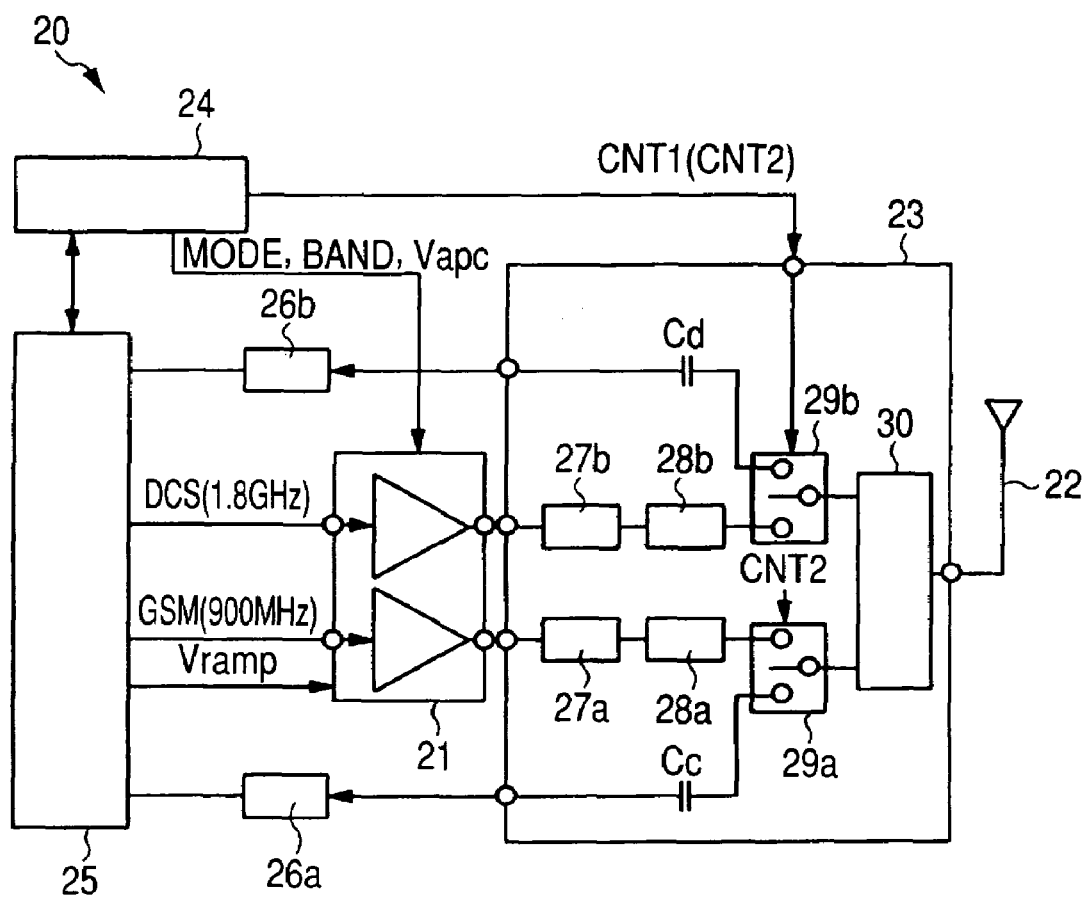
FIG. 25 is a circuit diagram of a radio communication device shown in Embodiment 5 of the present invention.
Figure 26:
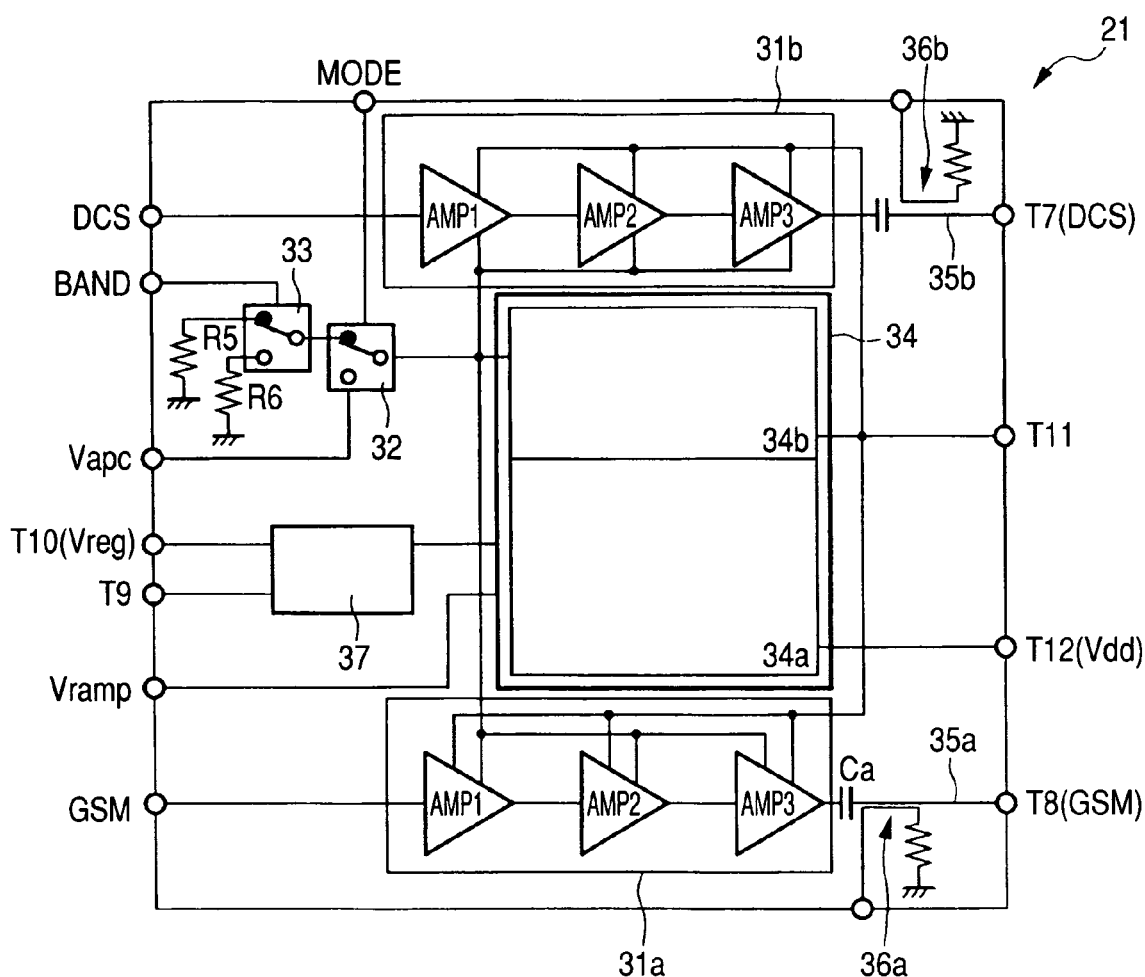
FIG. 26 is a circuit diagram of an RF power amplifier module shown in FIG. 25.
Figure 27:
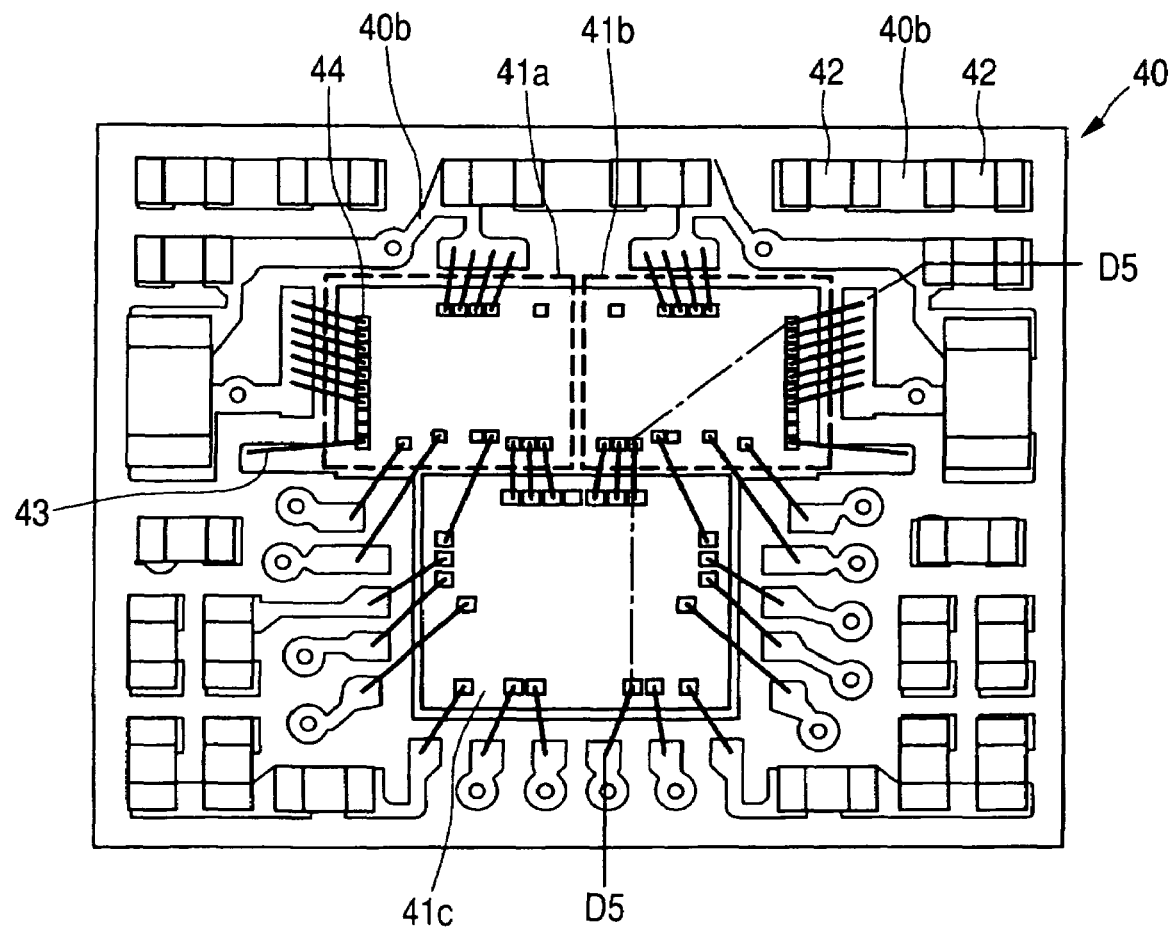
FIG. 27 is a schematic plan view of the RF power amplifier module shown in FIG. 26.
Figure 28:
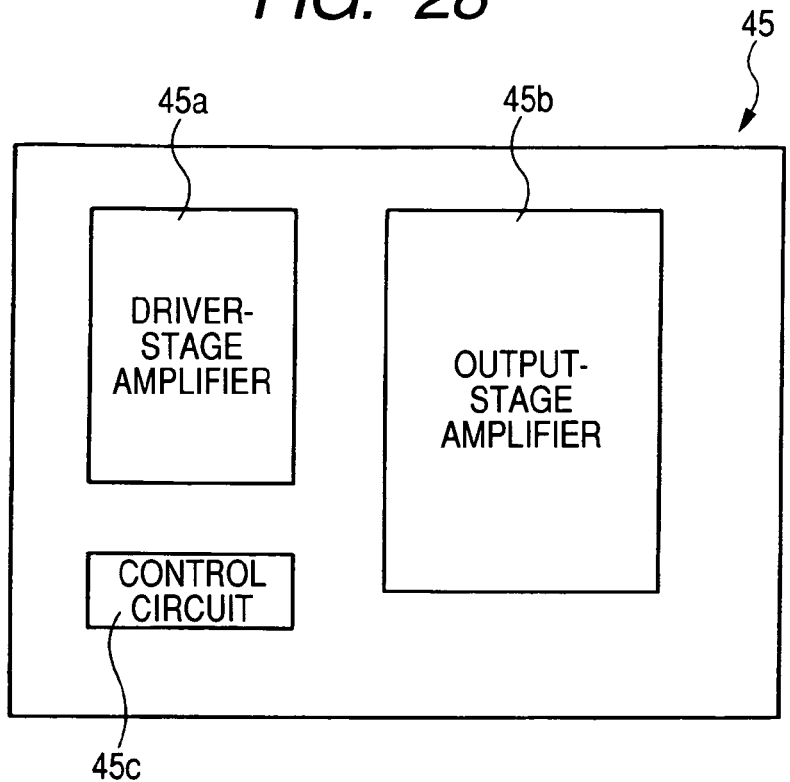
FIG. 28 is a block diagram of a semiconductor device for the RF amplifier module shown in FIG. 26.

FIG. 25 is a circuit diagram of a radio communication device 20 using an RF power amplifier module 21 comprising a semiconductor device such as, e.g., an MMIC. FIG. 26 is a circuit diagram of the RF power amplifier module 21 of FIG. 25. FIG. 27 is a schematic plan view of the RF power amplifier module 21 of FIG. 26. FIG. 28 is a block diagram of the MMIC for the RF power amplifier module 21 of FIG. 26. FIG. 29 is a schematic cross-sectional view of the RF power amplifier module 21 taken along the line D5-D5 of FIG. 27. The RF power amplifier module 21 uses frequencies of about 500 MHz or more and is compatible with, e.g., the GSM (Global System for Mobile Communication) mode using frequencies of about 800 MHz to 900 MHz, the DCS (Digital Cellular System) mode using frequencies of about 1.8 GHz to 1.9 GHz, or both of the two modes.

As shown in FIG. 25, the reference numeral 22 denotes an antenna for the transmission/reception of a signal wave, the reference numeral 23 denotes a front-end module, the reference numeral 24 denotes a base-band circuit for converting an audio signal to a base-band signal, converting a received signal to an audio signal, and generating a modulation-mode switch signal and a band switch signal, the reference numeral 25 denotes a modulator/demodulator circuit for down-converting and demodulating the received signal to generate a base-band signal and modulating a signal to be transmitted, and the reference numerals 26a and 26b denote filters for removing noise and an interfering wave from the received signal. The filter 26a is for the GSM mode and the filter 26b is for the DCS mode. The base-band circuit 24 is composed of a plurality of semiconductor integrated circuits such as a DSP (Digital Signal Processor), a microprocessor, and a semiconductor memory. The front-end module 23 has impedance matching circuits 27a and 27b, low-pass filters 28a and 28b, switching circuits 29a and 29b, capacitors Cc and Cd, and a branching filter 30.

FIG. 26 illustrates the RF power amplifier module 21 which allows the use of two frequency bands (dual band mode) which are, e.g., the GSM band and the DCS band and allows the use of two communication modes which are the GMSK (Gaussian filtered Minimum Shift Keying) modulation mode and the EDGE (Enhanced Data GSM Environment) modulation mode in each of the frequency bands. Accordingly, the RF power amplifier module 21 has an amplifier 31b for handling a transmitted signal DCS having a wave frequency in the DCS band and an amplifier 31a for handling a transmitted signal GSM having a wave frequency in the GSM band. In addition, a change-over switch 32 is provided to allow the use of the two communication modes which are the GMSK modulation mode and the EDGE modulation mode in each of the two frequency bands which are the GSM band and the DCS band. The change-over switch 32 is for inputting an output level control voltage Vapc supplied from the base-band circuit or the modulator/demodulator circuit to the amplifier circuits 31a and 31b in place of a power source voltage generated from an operating voltage control circuit 34. The switching of the change-over switch 32 is controlled by a mode signal MODE supplied from the base-band circuit. Moreover, resistors R5 and R6 and a change-over switch 33 are provided to perform switching between an initial bias voltage when a signal in the GSM band is transmitted and an initial bias voltage when a signal in the DCS band is transmitted. The switching of the change-over switch 33 is controlled by a band switch signal BAND for switching between the GSM band and the DCS band. The amplifier circuits 31a and 31b have respective output terminals connected to the terminals T7 and T8 for outputting of the RF power amplifier module 21 via respective capacitor elements Ca and Cb. The connection path is formed by microstrip lines 35a and 35b provided by a conductor pattern on a wiring board. Couplers 36a and 36b are formed in intervening relation in the respective microstrip lines 35a and 35b by providing conductor layers such that they are opposed to each other with a dielectric material layer interposed therebetween. The coupler 36b is used in the EDGE modulation mode in the DCS band, while the coupler 36a is used in the EDGE modulation mode in the GSM band.

The operating voltage control circuit 34 is used commonly by the amplifier circuits 31a and 31b. A power source switching circuit 37 is for controlling the ON/OFF operation of the common operating voltage control circuit 34. A signal for controlling the operation of the power source switching circuit 37 is inputted to a terminal T9 for inputting. To a power source terminal T10, an operating voltage Vreg supplied to the operating voltage control circuit 34 via the power source switching circuit 37 is applied. When the supply of the operating voltage Vreg to the operating voltage control circuit 34 is cut off by the power source switching circuit 37, the operation of the operating voltage control circuit 34 is halted. To allow the operation of amplifier circuit portions AMP1 to AMP3 with a voltage supplied directly from the outside even in such a state, a terminal T11 for inputting is provided. The reference numeral 34a denotes a power source control circuit, the reference numeral 34b denotes a bias voltage generator circuit, the reference mark Vramp denotes an input voltage to the power source control circuit 34a, the reference numeral T12 denotes a terminal connected to a power source circuit, and the reference mark Vdd denotes the power source voltage supplied from the power source circuit.

As shown in FIG. 27, a plurality of semiconductor chips 41a to 41c and a plurality of chip components 42 are mounted on the main surface of a wiring board 40 and a wiring pattern 40b is also formed thereon. Pads 44 on the respective main surfaces of the semiconductor chips 41a to 41c are electrically connected to the wiring pattern 40b on the main surface of the wiring board 40 via bonding wires 43. The semiconductor chip 41b is, e.g., an MMIC which composes a part of the RF power amplifier module 21 and has a driver-stage amplifier 45a, a power-stage amplifier 45b, and a control circuit 45c integrated in one chip, as shown in FIG. 28.

Figure 29:
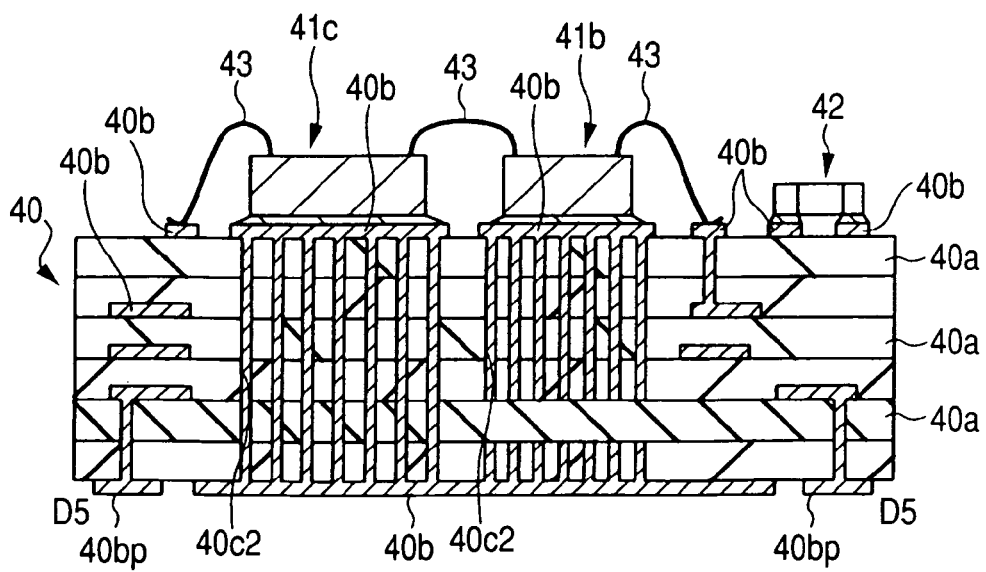
FIG. 29 is a schematic cross-sectional view of the RF module taken along the line D5-D5 of FIG. 26.
Figure 30:
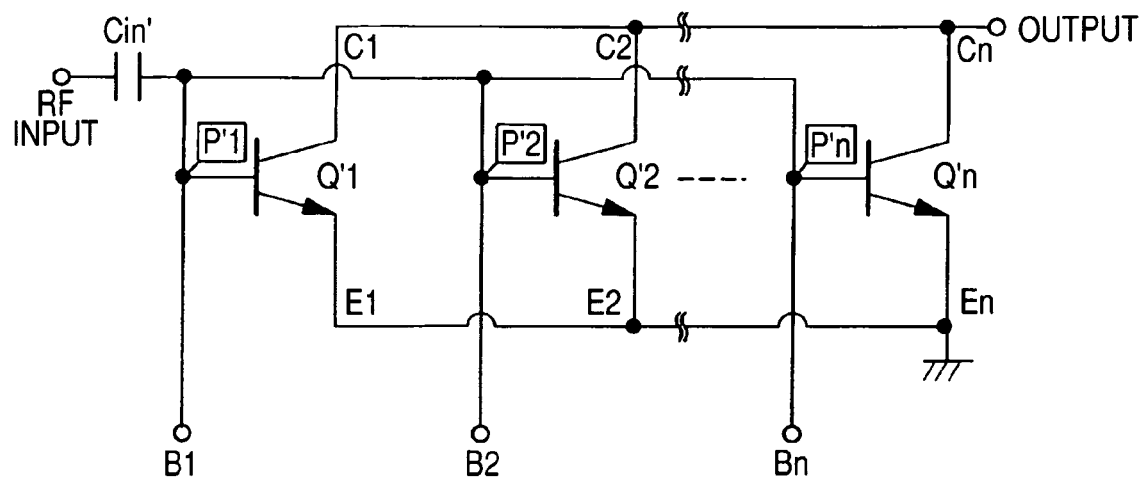
FIG. 30 is a circuit diagram of an amplifier circuit examined by the present inventors.
Figure 31:
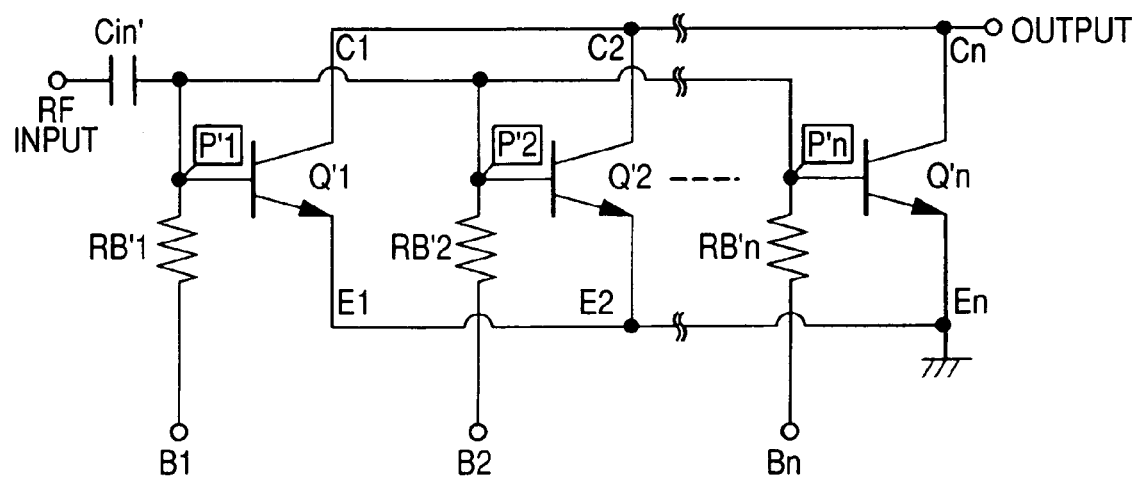
FIG. 31 is a circuit diagram of an amplifier circuit examined by the present inventors.
Figure 32:
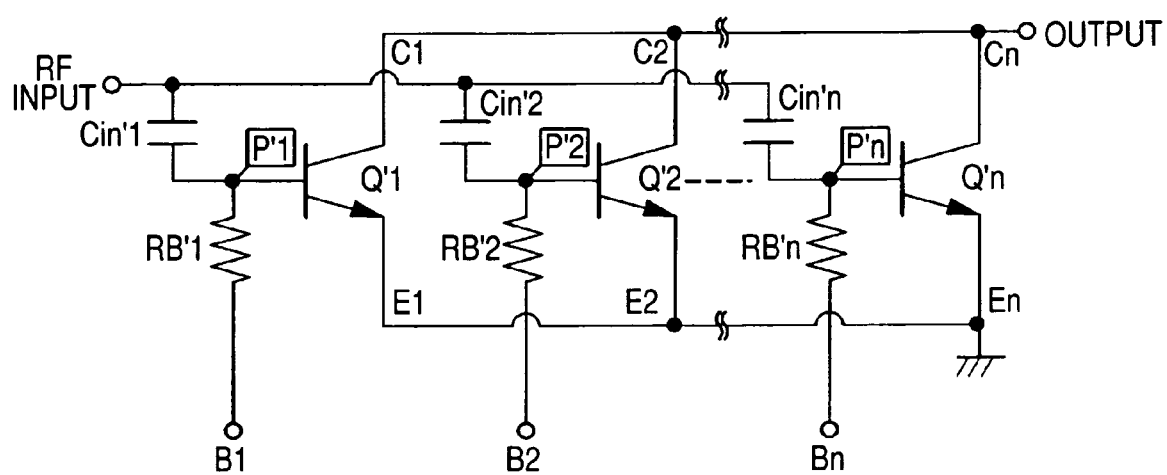
FIG. 32 is a circuit diagram of an amplifier circuit examined by the present inventors.
Figure 33:
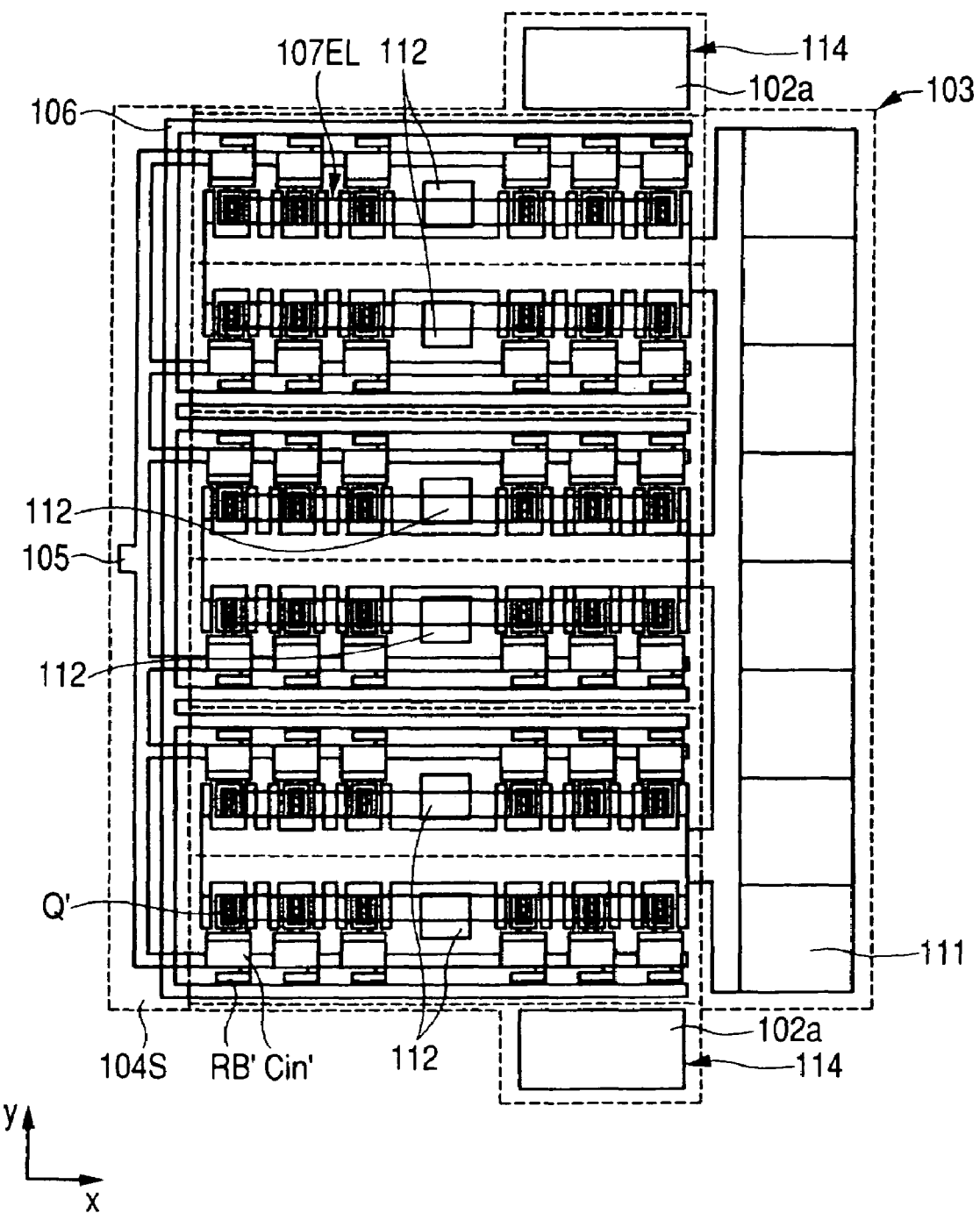
FIG. 33 is a principal-portion schematic plan view of a semiconductor device resulting from the device layout generation of the amplifier circuit shown in FIG. 32.
Figure 34:
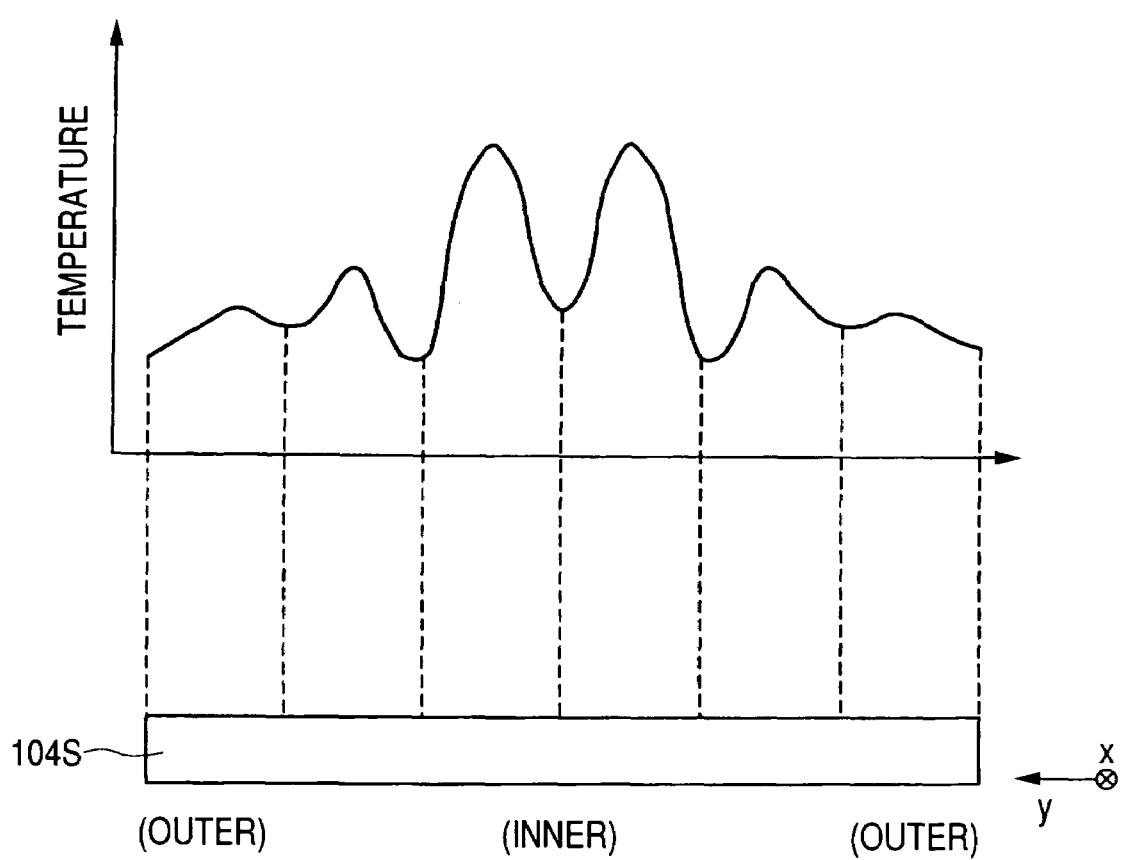
FIG. 34 is a view illustrating the semiconductor device shown in FIG. 33 during the operation thereof.

As shown in FIG. 29, the back-surface electrodes of the semiconductor chips 41b and 41c are electrically and thermally connected to conductor films in a plurality of via holes 40c2 via the wiring pattern 40b. The via holes 40c2 extend from the wiring pattern 40b for mounting chips of the wiring board 40 to reach the wiring pattern 40b for supplying a reference potential on the back surface of the wiring board 40, thereby providing electrical and thermal connection between the back surface electrode of the semiconductor chip 41c and the wiring pattern 40b for supplying a reference potential on the back surface of the wiring board 40. As a result, heat generated during the operation of the semiconductor chip 41c is dissipated from the back surface of the semiconductor chip 41c to the wiring pattern 40b for supplying a reference potential on the back surface of the wiring board 40 primarily through the via holes 40c2. The conductor films in the via holes 40c2 are made of an alloy of, e.g., copper (Cu) and tungsten (W).

The chip component 42 is formed with a capacitor element, a resistor, and an inductor for forming a matching circuit, a power source switching circuit, and the like. The chip component 42 is bonded to the wiring pattern 40b on the main surface of the wiring board 40 by using a bonding material and electrically connected thereto.

The RF power amplifier module 21 is mounted on a motherboard with the wiring pattern 40b for supplying a reference potential and a pad pattern 40bp on the back surface of the wiring board 40 each facing, e.g., the main surface of the motherboard.

Although the invention achieved by the present inventors has been described specifically with reference to the embodiments thereof, the present invention is not limited thereto. It will be appreciated that various changes and modifications can be made in the invention without departing from the gist thereof.

The present invention is used widely in the manufacturing industries of semiconductor devices.

What is claimed is:

1. A semiconductor device including a plurality of unit transistors, comprising:
a plurality of first transistor formation regions each having a first number of said unit transistors; and a second transistor formation region having a second number of said unit transistors, wherein said second transistor formation region is located between said first transistor formation regions, and wherein said first number is larger than said second number, wherein each of said unit transistors is a bipolar transistor having a collector electrode, a base electrode, and an emitter electrode, and wherein said unit transistors have said respective collector electrodes electrically connected to each other, said respective base electrodes electrically connected to each other, and said respective emitter electrodes electrically connected to each other, and wherein said unit transistors are formed over a substrate made of a compound, wherein a hole providing connection between each of said emitter electrodes and an electrode formed on a back surface of said substrate is located substantially in the middle of an arrangement of said first number of said unit transistors and substantially in the middle of an arrangement of said second number of said unit transistors.

2. A semiconductor device according to claim 1, wherein said unit transistors are arranged in a first direction in each of said first and second transistor formation regions, and wherein said first and second transistor formation regions are arranged in a second direction intersecting said first direction.

3. A semiconductor device according to claim 2, wherein said first and second transistor formation regions each have a first end and a second end, opposite said first end, wherein respective first ends of the first and second transistor formation regions are aligned with one another.

4. A semiconductor device according to claim 1, wherein a passive element is placed in said second transistor formation region.

5. A semiconductor device according to claim 4, wherein said passive element is a capacitor element.

6. A semiconductor device according to claim 1, wherein each of said unit transistors includes:
a substrate;
a collector layer formed over a main surface of said substrate;
a base layer formed over said collector layer;
an emitter layer comprised of an InGaP layer formed over said base layer;
a collector electrode electrically connected to said collector layer;
a base electrode electrically connected to said base layer;
an emitter mesa layer formed over said emitter layer and electrically connected to said emitter layer; and
an emitter electrode electrically connected to said emitter mesa layer, and
wherein said emitter mesa layer has, over said emitter layer, a ballast resistor layer electrically connected to said emitter layer.

7. A semiconductor device including a plurality of unit transistors, comprising:
a plurality of first transistor formation regions each having a first number of said unit transistors; and
a second transistor formation region having a second number of said unit transistors,
wherein said second transistor formation region is located between said first transistor formation regions, and
wherein said first number is larger than said second number, and
wherein a passive element is placed in said second transistor formation region,
wherein said passive element is a protective element for each of said unit transistors.

8. A semiconductor device according to claim 7,
wherein each of said unit transistors is a bipolar transistor having a collector electrode, a base electrode, and an emitter electrode, and
wherein said unit transistors have said respective collector electrodes electrically connected to each other, said respective base electrodes electrically connected to each other, and said respective emitter electrodes electrically connected to each other.

9. A semiconductor device according to claim 8, wherein said bipolar transistor is a hetero-junction bipolar transistor.

10. A semiconductor device according to claim 8, wherein said unit transistors are formed over a substrate made of a compound.

11. A semiconductor device according to claim 10, wherein said substrate is made of GaAs or InP.

12. A semiconductor device including a plurality of unit transistors, comprising:
a plurality of first transistor formation regions each having a first number of said unit transistors; and
a second transistor formation region having a second number of said unit transistors,
wherein said second transistor formation region is located between said first transistor formation regions, and
wherein said first number is larger than said second number,
wherein each of said unit transistors includes:
a substrate;
a collector layer formed over a main surface of said substrate;
a base layer formed over said collector layer;
an emitter layer comprised of an InGaP layer formed over said base layer;
a collector electrode electrically connected to said collector layer;
a base electrode electrically connected to said base layer;
an emitter mesa layer formed over said emitter layer and electrically connected to said emitter layer; and
an emitter electrode electrically connected to said emitter mesa layer, and
wherein said emitter mesa layer has, over said emitter layer, a ballast resistor layer electrically connected to said emitter layer,
wherein said first and second transistor formation regions each have a first end and a second end, opposite said first end, and wherein a hole providing connection between each of said emitter electrodes and an electrode formed on a back surface of said substrate is located adjacent respective first ends of said first and second transistor formation regions.

13. A semiconductor device including a plurality of unit transistors, comprising:
a plurality of first transistor formation regions each having a first number of said unit transistors; and
a second transistor formation region having a second number of said unit transistors,
wherein said second transistor formation region is located between said first transistor formation regions, and
wherein said first number is larger than said second number, wherein each of said unit transistors includes:
- a substrate;
- a collector layer formed over a main surface of said substrate;
- a base layer formed over said collector layer;
- an emitter layer comprised of an InGaP layer formed over said base layer;
- a collector electrode electrically connected to said collector layer;
- a base electrode electrically connected to said base layer;
- an emitter mesa layer formed over said emitter layer and electrically connected to said emitter layer; and
- an emitter electrode electrically connected to said emitter mesa layer, and wherein said emitter mesa layer has, over said emitter layer, a ballast resistor layer electrically connected to said emitter layer, wherein said first and second transistor formation regions each have a first end and a second end, opposite said first end, and wherein a capacitor element is disposed adjacent respective first ends of said first and second transistor formation regions.

* * * * *